US010194153B1

(12) United States Patent
    Maaninen

(10) Patent No.: US 10,194,153 B1
(45) Date of Patent: Jan. 29, 2019

(54) BIN STRING CODING BASED ON A MOST PROBABLE SYMBOL

(71) Applicant: GOOGLE LLC, Mountain View, CA (US)

(72) Inventor: Juha Pekka Maaninen, Sunnyvale, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 15/983,662

(22) Filed: May 18, 2018

Related U.S. Application Data

(63) Continuation of application No. 15/813,387, filed on Nov. 15, 2017, now Pat. No. 9,992,496.

(51) Int. Cl.
| *H03M 7/00* | (2006.01) |
| *H04N 19/124* | (2014.01) |
| *H04N 19/60* | (2014.01) |
| *H04N 19/13* | (2014.01) |
| *H03M 7/40* | (2006.01) |
| *H04N 19/184* | (2014.01) |
| *H04N 19/70* | (2014.01) |

(52) U.S. Cl.
CPC ........ *H04N 19/124* (2014.11); *H03M 7/4006* (2013.01); *H04N 19/13* (2014.11); *H04N 19/60* (2014.11); *H04N 19/184* (2014.11); *H04N 19/70* (2014.11)

(58) Field of Classification Search
CPC ...... H04N 19/13; H04N 19/60; H03M 7/4006
USPC ....................................................... 341/107
See application file for complete search history.

(56) References Cited

U.S. PATENT DOCUMENTS

| 7,932,843 | B2 | 4/2011 | Demircin et al. |
| 9,379,236 | B2 * | 6/2016 | Ponoth .............. H01L 29/66681 |
| 9,503,750 | B2 * | 11/2016 | Gao ..................... H04N 19/593 |
| 9,584,802 | B2 | 2/2017 | Sze et al. |
| 9,681,133 | B2 | 6/2017 | Chan et al. |
| 9,992,496 | B1 * | 6/2018 | Maaninen ............ H04N 19/124 |
| 2010/0007534 | A1 | 1/2010 | Girardeau, Jr. |
| 2010/0040148 | A1 | 2/2010 | Marpe et al. |
| 2011/0280314 | A1 | 11/2011 | Sankaran et al. |

(Continued)

OTHER PUBLICATIONS

Bankoski, et al., "Technical Overview of VP8, an Open Source Video Codec for the Web", Jul. 11, 2011, 6 pp.

(Continued)

*Primary Examiner* — Lam T Mai
(74) *Attorney, Agent, or Firm* — Young Basile Hanlon & MacFarlane, P.C.

(57) ABSTRACT

Bins of a bin string representative of binarized video data are processed to determine whether each bin stores a most probable symbol of a probability model available for coding the binarized video data. If the symbol stored in each bin of the bin string is the most probable symbol, the probability model is updated based on a size of the bin string to determine a first number of bits to use to code the binarized video data. However, if the symbol stored in each bin of the bin string is not the most probable symbol, the probability model is updated based on a number of bins of the bin string storing a symbol that is not the most probable symbol to determine a second number of bits to use to code the binarized video data.

20 Claims, 14 Drawing Sheets

(56) References Cited

U.S. PATENT DOCUMENTS

2015/0373379 A1 12/2015 Chandrashekar et al.
2017/0155909 A1 6/2017 Sze et al.

OTHER PUBLICATIONS

Bankoski et al, "VP8 Data Format and Decoding Guide", Independent Submission RFC 6389, Nov. 2011, 305 pp.
Bankoski et al., "VP8 Data Format and Decoding Guide draft-bankoski-vp8-bitstream-02", Network Working Group, Internet-Draft, May 18, 2011, 288 pp.
Series H: Audiovisual and Multimedia Systems, Coding of moving video: Implementors Guide for H.264: Advanced video coding for generic audiovisual services, International Telecommunication Union, Jul. 30, 2010, 15 pp.
"Introduction to Video Coding Part 1: Transform Coding", Mozilla, Mar. 2012, 171 pp.
"Overview VP7 Data Format and Decoder", Version 1.5, On2 Technologies, Inc., Mar. 28, 2005, 65 pp.
Series H: Audiovisual and Multimedia Systems, Infrastructure of audiovisual services—Coding of moving video, Advanced video coding for generic audiovisual services, International Telecommunication Union, Version 11, Mar. 2009. 670 pp.
Series H: Audiovisual and Multimedia Systems, Infrastructure of audiovisual services—Coding of moving video, Advanced video coding for generic audiovisual services, International Telecommunication Union, Version 12, Mar. 2010, 676 pp.
Series H: Audiovisual and Multimedia Systems, Infrastructure of audiovisual services—Coding of moving video, Amendment 2: New profiles for professional applications, International Telecommunication Union, Apr. 2007, 75 pp.
Series H: Audiovisual and Multimedia Systems, Infrastructure of audiovisual services—Coding of moving video, Advanced video coding for generic audiovisual services, Version 8, International Telecommunication Union, Nov. 1, 2007, 564 pp.
Series H: Audiovisual and Multimedia Systems, Infrastructure of audiovisual services—Coding of moving video, Advanced video coding for generic audiovisual services, Amendment 1: Support of additional colour spaces and removal of the High 4:4:4 Profile, International Telecommunication Union, Jun. 2006, 16 pp.
Series H: Audiovisual and Multimedia Systems, Infrastructure of audiovisual services—Coding of moving video, Advanced video coding for generic audiovisual services, Version 1, International Telecommunication Union, May 2003, 282 pp.
Series H: Audiovisual and Multimedia Systems, Infrastructure of audiovisual services—Coding of moving video, Advanced video coding for generic audiovisual services, Version 3, International Telecommunication Union, Mar. 2005, 343 pp.
"VP6 Bitstream and Decoder Specification", Version 1.02, On2 Technologies, Inc., Aug. 17, 2006, 88 pp.
"VP6 Bitstream and Decoder Specification", Version 1.03, On2 Technologies, Inc., Oct. 29, 2007, 95 pp.
"VP8 Data Format and Decoding Guide, WebM Project", Google On2, Dec. 1, 2010, 103 pp.
International Search Report and Written Opinion in PCT/US2018/046451, dated Oct. 22, 2018, 16 pgs.
Kwanghyun Won et al., "Rate Estimation for CABAC with Low Complexity", 2013 IEEE International Symposium on Broadband Multimedia Systems and Broadcasting (BMSB), IEEE, Jun. 5, 2013, pp. 1-4.
Grzegorz Pastuszak, "High-Speed Architecture of the CABAC Probability Modeling for H. 265/HEVC Encoders", 2016 International Conference on Signals and Electronic Systems (ICSES), IEEE, Sep. 5, 2016, pp. 143-146.
Kun-Bin Lee et al., "A Multisymbol Context-Based Arithmetic Coding Architecture for MPEG-4 Shape Coding", IEEE Transactions on Circuits and Systems for Video Technology, vol. 15, No. 2, Feb. 1, 2005, pp. 283-295.
Alexander Alshin et al., "Multi-parameter probability up-date for CABAC", Joint Collaborative Team on Video Coding (JCT-VC) of ITU-T SG16 WP3 and ISO/IEC JTC1/SC29/WG11, 6th Meeting, Torino, IT, Jul. 14-22, 2011, No. JCTVC-F254, Jul. 12, 2011, pp. 1-5.
Vivienne Sze et al. "Chapter 8: Entropy Coding in HEVC", , High Efficiency Video Coding (HEVC), Springer International Publishing, Jan. 1, 2014, pp. 209-269.

\* cited by examiner

1300

| State | MPS | LPS | State | MPS | LPS | State | MPS | LPS |
|---|---|---|---|---|---|---|---|---|
| 0 | 1.0000 | 1.000 | 21 | 0.2632 | 2.5000 | 42 | 0.0833 | 4.0000 |
| 1 | 0.9130 | 1.000 | 22 | 0.2500 | 2.6667 | 43 | 0.0784 | 4.2500 |
| 2 | 0.8333 | 1.000 | 23 | 0.2432 | 2.7500 | 44 | 0.0741 | 4.2500 |
| 3 | 0.8182 | 1.2500 | 24 | 0.2239 | 2.7500 | 45 | 0.0714 | 4.3333 |
| 4 | 0.7500 | 1.2500 | 25 | 0.2105 | 3.0000 | 46 | 0.0667 | 4.5000 |
| 5 | 0.7000 | 1.3333 | 26 | 0.2000 | 3.0000 | 47 | 0.0635 | 4.5000 |
| 6 | 0.6667 | 1.5000 | 27 | 0.1905 | 3.0000 | 48 | 0.0606 | 4.5000 |
| 7 | 0.6250 | 1.5000 | 28 | 0.1786 | 3.0000 | 49 | 0.0577 | 4.6667 |
| 8 | 0.5714 | 1.6667 | 29 | 0.1667 | 3.0000 | 50 | 0.0556 | 4.7500 |
| 9 | 0.5455 | 1.6667 | 30 | 0.1613 | 3.2500 | 51 | 0.0517 | 4.7500 |
| 10 | 0.5000 | 1.7500 | 31 | 0.1538 | 3.2500 | 52 | 0.0500 | 4.7500 |
| 11 | 0.4800 | 1.7500 | 32 | 0.1429 | 3.5000 | 53 | 0.0460 | 5.0000 |
| 12 | 0.4615 | 2.0000 | 33 | 0.1356 | 3.5000 | 54 | 0.0448 | 5.0000 |
| 13 | 0.4286 | 2.0000 | 34 | 0.1282 | 3.5000 | 55 | 0.0417 | 5.0000 |
| 14 | 0.4000 | 2.0000 | 35 | 0.1212 | 3.6667 | 56 | 0.0392 | 5.0000 |
| 15 | 0.3750 | 2.0000 | 36 | 0.1154 | 3.6667 | 57 | 0.0370 | 5.2500 |
| 16 | 0.3478 | 2.2500 | 37 | 0.1111 | 3.7500 | 58 | 0.0364 | 5.2500 |
| 17 | 0.3333 | 2.2500 | 38 | 0.1034 | 3.7500 | 59 | 0.0345 | 5.3333 |
| 18 | 0.3226 | 2.3333 | 39 | 0.1000 | 4.0000 | 60 | 0.0323 | 5.5000 |
| 19 | 0.3000 | 2.5000 | 40 | 0.0938 | 4.0000 | 61 | 0.0303 | 5.5000 |
| 20 | 0.2778 | 2.5000 | 41 | 0.0889 | 4.0000 | 62 | 0.0290 | 5.5000 |

| S | 0 | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|----|----|----|----|----|----|----|----|----|
| C | 1 | 2 | 3 | 4 | 4 | 5 | 5 | 6 | 6 | 7 | 7 | 8 | 8 | 9 | 9 | 9 | 10 | 10 | 10 |
| S | 19 | 20 | 21 | 22 | 23 | 24 | 25 | 26 | 27 | 28 | 29 | 30 | 31 | 32 | 33 | 34 | 35 | 36 | 37 |
| C | 10 | 11 | 11 | 11 | 11 | 11 | 11 | 12 | 12 | 12 | 12 | 12 | 12 | 12 | 12 | 13 | 13 | 13 | 13 |
| S | 38 | 39 | 40 | 41 | 42 | 43 | 44 | 45 | 46 | 47 | 48 | 49 | 50 | 51 | 52 | 53 | 54 | 55 | 56 |
| C | 13 | 13 | 13 | 13 | 13 | 13 | 13 | 13 | 13 | 13 | 13 | 13 | 14 | 14 | 14 | 14 | 14 | 14 | 14 |
| S | 57 | 58 | 59 | 60 | 61 | 62 | | | | | | | | | | | | | |
| C | 14 | 14 | 14 | 14 | 14 | 14 | | | | | | | | | | | | | |

BIN STRING CODING BASED ON A MOST PROBABLE SYMBOL

CROSS-REFERENCE TO RELATED APPLICATION(S)

This disclosure is a continuation of U.S. patent application Ser. No. 15/813,387, filed Nov. 15, 2017, the disclosure of which is incorporated by reference herein in its entirety.

BACKGROUND

Digital video streams may represent video using a sequence of frames or still images. Digital video can be used for various applications including, for example, video conferencing, high definition video entertainment, video advertisements, or sharing of user-generated videos. A digital video stream can contain a large amount of data and consume a significant amount of computing or communication resources of a computing device for processing, transmission, or storage of the video data. Various approaches have been proposed to reduce the amount of data in video streams, including encoding or decoding techniques.

SUMMARY

A method for encoding binarized video data based on changes in probabilities of a probability model according to an implementation of this disclosure comprises receiving a bin string representative of the binarized video data. The bin string includes bins that each store a symbol. The method further comprises identifying the symbol stored in one of the bins as a current symbol. The method further comprises determining whether the current symbol is a most probable symbol of the probability model. The method further comprises, responsive to determining that the current symbol is not the most probable symbol, updating at least one of the probabilities. The probabilities include a first probability associated with the most probable symbol and a second probability associated with a least probable symbol of the probability model. The method further comprises, subsequent to updating the probabilities, determining whether the second probability is greater than the first probability. The method further comprises, responsive to determining that the second probability is greater than the first probability, switching the most probable symbol and the least probable symbol to reflect that the least probable symbol is a new most probable symbol of the probability model and to reflect that the most probable symbol is a new least probable symbol of the probability model. The method further comprises determining a first number of bits to use to encode the binarized video data using the new most probable symbol. The method further comprises encoding the binarized video data to a bitstream using the first number of bits.

An apparatus for encoding binarized video data based on changes in probabilities of a probability model according to an implementation of this disclosure comprises a processor configured to execute instructions stored in a non-transitory storage medium. The instructions include instructions to receive a bin string representative of the binarized video data. The bin string includes bins that each store a symbol. The instructions further include instructions to identify the symbol stored in one of the bins as a current symbol. The instructions further include instructions to determine whether the current symbol is a most probable symbol of the probability model. The instructions further include instructions to, responsive to the determination that the current symbol is not the most probable symbol, update the probabilities by decreasing a first probability associated with the most probable symbol and increasing a second probability associated with a least probable symbol of the probability model. The instructions further include instructions to, subsequent to updating the probabilities, determine whether the second probability is greater than the first probability. The instructions further include instructions to, responsive to a determination that the second probability is greater than the first probability: switch the most probable symbol and the least probable symbol to reflect that the least probable symbol is a new most probable symbol of the probability model and to reflect that the most probable symbol is a new least probable symbol of the probability model, determine a first number of bits to use to encode the binarized video data using the new most probable symbol, and encode the binarized video data to a bitstream using the first number of bits. The instructions further include instructions to, responsive to a determination that the second probability is not greater than the first probability: determine a second number of bits to use to encode the binarized video data based on at least one of the first probability or the second probability, and encode the binarized video data to the bitstream using the second number of bits.

A method for encoding binarized video data based on changes in probabilities of a probability model according to an implementation of this disclosure comprises receiving a bin string representative of the binarized video data. The bin string includes bins that each store a symbol. The method further comprises updating a probability model available for encoding the binarized video data based on a determination that a current symbol stored in one of the bins is not a most probable symbol of the probability model. The method further comprises determining whether the updated probability model reflects a greater probability that symbols stored in ones of the bins of the bin string are a least probable symbol of the probability model than the most probably symbol. The method further comprises, subsequent to determining that the updated probability model reflects the greater probability, determining a first number of bits to use to encode the binarized video data based on a probability associated with the least probable symbol. The method further comprises encoding the binarized video data to a bitstream using the first number of bits.

These and other aspects of the present disclosure are disclosed in the following detailed description of the embodiments, the appended claims and the accompanying figures.

BRIEF DESCRIPTION OF THE DRAWINGS

The description herein makes reference to the accompanying drawings described below, wherein like reference numerals refer to like parts throughout the several views.

FIG. 13 is an illustration of a table reflecting numbers of bits required to code a most probable symbol or a least probable symbol of a probability model based on a given state of the probability model.

FIG. 14 is an illustration of a table reflecting probability changes for a most probable symbol and a least probable symbol of a probability model.

DETAILED DESCRIPTION

Figure 1:
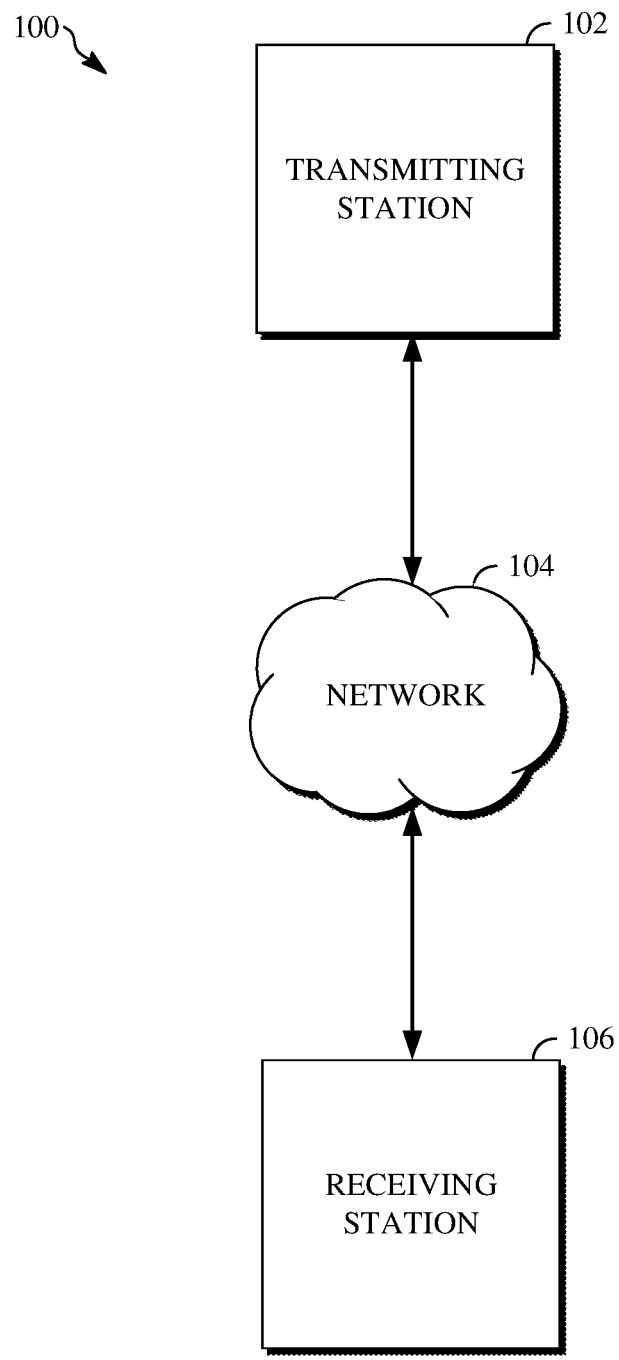
FIG. 1 is a schematic of a video encoding and decoding system.

Video compression schemes may include breaking respective images, or frames, into smaller portions, such as blocks, and generating an output bitstream using techniques to limit the information included for respective blocks in the output. An encoded bitstream can be decoded to re-create the source images from the limited information. Typical video compression and decompression techniques use entropy coding to further reduce the number bits required to encode video data to or decode video data from a bitstream. For example, entropy coding may include using arithmetic coding or the like to reduce the amount of data that needs to be encoded to a bitstream after that data is transformed and quantized.

One example of an arithmetic coding technique is Context Adaptive Binary Arithmetic Coding (CABAC). In CABAC, each possible value of a symbol to encode or decode is associated with a probability that the next symbol to encode or decode will have the same value. For example, for a string of three symbols, AAB, the probability that the value of a given symbol of the string is A is about 66 percent and the probability that the value of a given symbol of the string is B is about 33 percent. The probability distribution for values of symbols to encode or decode can be used to reduce the amount of data to encode or decode, such as by using fewer numbers of bits to code more probable symbols and larger numbers of bits to code for less probable symbols. For example, if it is known that the value of most symbols in a string are A, a fraction of a bit can be used to encode each symbol having the value A, such as instead of the 1 bit typically used to encode a value.

The values of symbols associated with a video coding aspect (e.g., a quantized transform coefficient, a motion vector difference, or the like) can be stored in a bin string, wherein each bin of the bin string stores one of the values. The probabilities of different values change after each bin is processed. For example, a CABAC engine can adjust probabilities of a symbol value stored in a current bin based on the symbol values stored in bins that have already been processed. Thus, if a long string of a particular symbol value is coded, the CABAC engine can adjust the probability of that particular symbol value to reflect that it is more probable than it initially was.

However, this may also mean that the coding of a symbol value stored in a current bin depends on information associated with a previously coded bin. Where a hardware component is used to perform the entropy coding, the dependency of a current bin on a previously-coded bin limits the data throughput to processing one bin per clock cycle. Given that a single bin string may include a large number of bins and there may be a large number of bin strings for each video block to encode, for example, it might take a long time to entropy code video data.

Implementations of this disclosure address problems such as these by entropy coding a bin string representative of binarized video data based on the number of most probable symbols stored in the bins of the bin string. Bins of a bin string representative of binarized video data are processed to determine whether each bin stores a most probable symbol of a probability model available for coding the binarized video data. If the symbol stored in each bin of the bin string is the most probable symbol, the probability model is updated based on a size of the bin string to determine a first number of bits to use to code the binarized video data. However, if the symbol stored in each bin of the bin string is not the most probable symbol, the probability model is updated based on a number of bins of the bin string storing a symbol that is not the most probable symbol to determine a second number of bits to use to code the binarized video data.

The probability model has a state that reflects a number of bits required to code each of the most probable symbol of the probability model and a least probable symbol of the probability model. Upon determining that a symbol stored in a current bin is the most probable symbol, the state of the probability model increases such that the probability of the most probable symbol increases and the probability of the least probable symbol decreases. Upon determining that a symbol stored in a current bin is the least probable symbol, the state of the probability model decreases such that the probability of the most probable symbol decreases and the probability of the least probable symbol increases. After processing a last bin of the bin string, the numbers of bits associated with the final state of the probability model are used to determine a number of bits to use to code binarized video data. In at least some cases, multiple bins can thus be processed in a single clock cycle, thus improving the speed for coding binarized video data using arithmetic coding techniques.

Further details of techniques for coding binarized video data are described herein with initial reference to a system in which they can be implemented, as shown in FIGS. 1 through 5. FIG. 1 is a schematic of a video encoding and decoding system 100. A transmitting station 102 can be, for example, a computer having an internal configuration of hardware such as that described in FIG. 2. However, other implementations of the transmitting station 102 are possible. For example, the processing of the transmitting station 102 can be distributed among multiple devices.

A network 104 can connect the transmitting station 102 and a receiving station 106 for encoding and decoding of the video stream. Specifically, the video stream can be encoded in the transmitting station 102, and the encoded video stream can be decoded in the receiving station 106. The network 104 can be, for example, the Internet. The network 104 can also be a local area network (LAN), wide area network (WAN), virtual private network (VPN), cellular telephone network, or any other means of transferring the video stream from the transmitting station 102 to, in this example, the receiving station 106.

Figure 2:
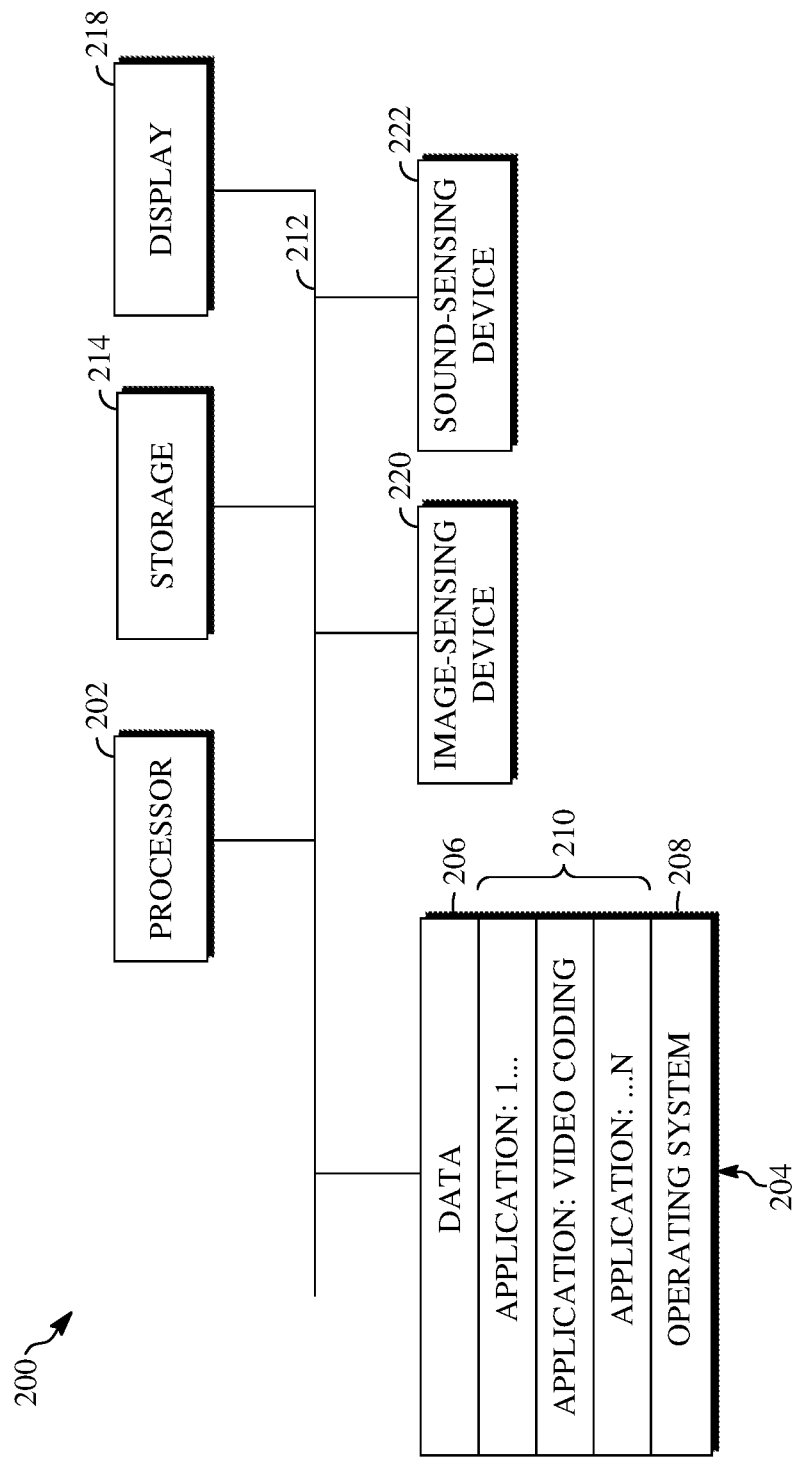
FIG. 2 is a block diagram of an example of a computing device that can implement a transmitting station or a receiving station.

The receiving station 106, in one example, can be a computer having an internal configuration of hardware such as that described in FIG. 2. However, other suitable implementations of the receiving station 106 are possible. For example, the processing of the receiving station 106 can be distributed among multiple devices.

Other implementations of the video encoding and decoding system 100 are possible. For example, an implementation can omit the network 104. In another implementation, a video stream can be encoded and then stored for transmission at a later time to the receiving station 106 or any other device having memory. In one implementation, the receiving station 106 receives (e.g., via the network 104, a computer bus, and/or some communication pathway) the encoded video stream and stores the video stream for later decoding. In an example implementation, a real-time transport protocol (RTP) is used for transmission of the encoded video over the network 104. In another implementation, a transport protocol other than RTP may be used (e.g., a Hypertext Transfer Protocol-based (HTTP-based) video streaming protocol).

When used in a video conferencing system, for example, the transmitting station 102 and/or the receiving station 106 may include the ability to both encode and decode a video stream as described below. For example, the receiving station 106 could be a video conference participant who receives an encoded video bitstream from a video conference server (e.g., the transmitting station 102) to decode and view and further encodes and transmits his or her own video bitstream to the video conference server for decoding and viewing by other participants.

FIG. 2 is a block diagram of an example of a computing device 200 that can implement a transmitting station or a receiving station. For example, the computing device 200 can implement one or both of the transmitting station 102 and the receiving station 106 of FIG. 1. The computing device 200 can be in the form of a computing system including multiple computing devices, or in the form of one computing device, for example, a mobile phone, a tablet computer, a laptop computer, a notebook computer, a desktop computer, and the like.

A processor 202 in the computing device 200 can be a conventional central processing unit. Alternatively, the processor 202 can be another type of device, or multiple devices, capable of manipulating or processing information now existing or hereafter developed. For example, although the disclosed implementations can be practiced with one processor as shown (e.g., the processor 202), advantages in speed and efficiency can be achieved by using more than one processor.

A memory 204 in computing device 200 can be a read only memory (ROM) device or a random access memory (RAM) device in an implementation. However, other suitable types of storage device can be used as the memory 204. The memory 204 can include code and data 206 that is accessed by the processor 202 using a bus 212. The memory 204 can further include an operating system 208 and application programs 210, the application programs 210 including at least one program that permits the processor 202 to perform the techniques described herein. For example, the application programs 210 can include applications 1 through N, which further include a video coding application that performs the techniques described herein. The computing device 200 can also include a secondary storage 214, which can, for example, be a memory card used with a mobile computing device. Because the video communication sessions may contain a significant amount of information, they can be stored in whole or in part in the secondary storage 214 and loaded into the memory 204 as needed for processing.

The computing device 200 can also include one or more output devices, such as a display 218. The display 218 may be, in one example, a touch sensitive display that combines a display with a touch sensitive element that is operable to sense touch inputs. The display 218 can be coupled to the processor 202 via the bus 212. Other output devices that permit a user to program or otherwise use the computing device 200 can be provided in addition to or as an alternative to the display 218. When the output device is or includes a display, the display can be implemented in various ways, including by a liquid crystal display (LCD), a cathode-ray tube (CRT) display, or a light emitting diode (LED) display, such as an organic LED (OLED) display.

The computing device 200 can also include or be in communication with an image-sensing device 220, for example, a camera, or any other image-sensing device 220 now existing or hereafter developed that can sense an image such as the image of a user operating the computing device 200. The image-sensing device 220 can be positioned such that it is directed toward the user operating the computing device 200. In an example, the position and optical axis of the image-sensing device 220 can be configured such that the field of vision includes an area that is directly adjacent to the display 218 and from which the display 218 is visible.

The computing device 200 can also include or be in communication with a sound-sensing device 222, for example, a microphone, or any other sound-sensing device now existing or hereafter developed that can sense sounds near the computing device 200. The sound-sensing device 222 can be positioned such that it is directed toward the user operating the computing device 200 and can be configured to receive sounds, for example, speech or other utterances, made by the user while the user operates the computing device 200.

Although FIG. 2 depicts the processor 202 and the memory 204 of the computing device 200 as being integrated into one unit, other configurations can be utilized. The operations of the processor 202 can be distributed across multiple machines (wherein individual machines can have one or more processors) that can be coupled directly or across a local area or other network. The memory 204 can be distributed across multiple machines such as a network-based memory or memory in multiple machines performing the operations of the computing device 200. Although depicted here as one bus, the bus 212 of the computing device 200 can be composed of multiple buses. Further, the secondary storage 214 can be directly coupled to the other components of the computing device 200 or can be accessed via a network and can comprise an integrated unit such as a memory card or multiple units such as multiple memory cards. The computing device 200 can thus be implemented in a wide variety of configurations.

Figure 3:
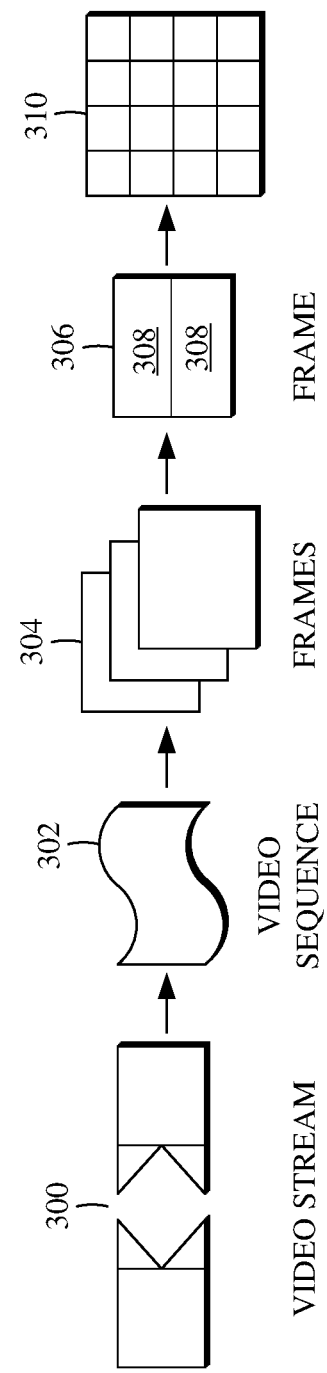
FIG. 3 is a diagram of a typical video stream to be encoded and subsequently decoded.

FIG. 3 is a diagram of an example of a video stream 300 to be encoded and subsequently decoded. The video stream 300 includes a video sequence 302. At the next level, the video sequence 302 includes a number of adjacent frames 304. While three frames are depicted as the adjacent frames 304, the video sequence 302 can include any number of adjacent frames 304. The adjacent frames 304 can then be further subdivided into individual frames, for example, a frame 306. At the next level, the frame 306 can be divided into a series of planes or segments 308. The segments 308 can be subsets of frames that permit parallel processing, for example. The segments 308 can also be subsets of frames that can separate the video data into separate colors. For example, a frame 306 of color video data can include a luminance plane and two chrominance planes. The segments 308 may be sampled at different resolutions.

Whether or not the frame 306 is divided into segments 308, the frame 306 may be further subdivided into blocks 310, which can contain data corresponding to, for example, 16×16 pixels in the frame 306. The blocks 310 can also be arranged to include data from one or more segments 308 of pixel data. The blocks 310 can also be of any other suitable size such as 4×4 pixels, 8×8 pixels, 16×8 pixels, 8×16 pixels, 16×16 pixels, or larger. Unless otherwise noted, the terms block and macroblock are used interchangeably herein.

Figure 4:
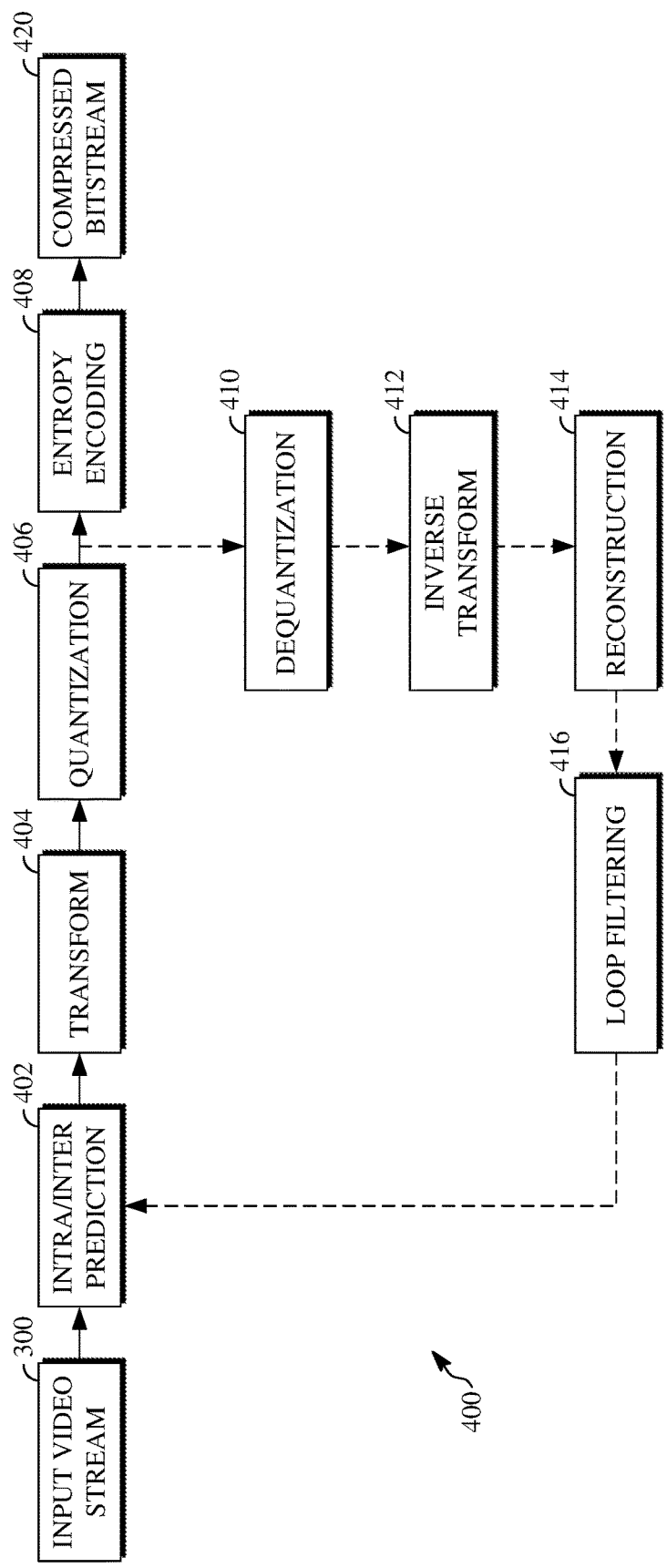
FIG. 4 is a block diagram of an encoder according to implementations of this disclosure.

FIG. 4 is a block diagram of an encoder 400 according to implementations of this disclosure. The encoder 400 can be implemented, as described above, in the transmitting station 102, such as by providing a computer software program stored in memory, for example, the memory 204. The computer software program can include machine instructions that, when executed by a processor such as the processor 202, cause the transmitting station 102 to encode video data in the manner described in FIG. 4. The encoder 400 can also be implemented as specialized hardware included in, for example, the transmitting station 102. In one particularly desirable implementation, the encoder 400 is a hardware encoder.

The encoder 400 has the following stages to perform the various functions in a forward path (shown by the solid connection lines) to produce an encoded or compressed bitstream 420 using the video stream 300 as input: an intra/inter prediction stage 402, a transform stage 404, a quantization stage 406, and an entropy encoding stage 408. The encoder 400 may also include a reconstruction path (shown by the dotted connection lines) to reconstruct a frame for encoding of future blocks. In FIG. 4, the encoder 400 has the following stages to perform the various functions in the reconstruction path: a dequantization stage 410, an inverse transform stage 412, a reconstruction stage 414, and a loop filtering stage 416. Other structural variations of the encoder 400 can be used to encode the video stream 300.

When the video stream 300 is presented for encoding, respective adjacent frames 304, such as the frame 306, can be processed in units of blocks. At the intra/inter prediction stage 402, respective blocks can be encoded using intra-frame prediction (also called intra-prediction) or inter-frame prediction (also called inter-prediction). In any case, a prediction block can be formed. In the case of intra-prediction, a prediction block may be formed from samples in the current frame that have been previously encoded and reconstructed. In the case of inter-prediction, a prediction block may be formed from samples in one or more previously constructed reference frames.

Next, the prediction block can be subtracted from the current block at the intra/inter prediction stage 402 to produce a residual block (also called a residual). The transform stage 404 transforms the residual into transform coefficients in, for example, the frequency domain using block-based transforms. The quantization stage 406 converts the transform coefficients into discrete quantum values, which are referred to as quantized transform coefficients, using a quantizer value or a quantization level. For example, the transform coefficients may be divided by the quantizer value and truncated.

The quantized transform coefficients are then entropy encoded by the entropy encoding stage 408. The entropy-encoded coefficients, together with other information used to decode the block (which may include, for example, syntax elements such as used to indicate the type of prediction used, transform type, motion vectors, a quantizer value, or the like), are then output to the compressed bitstream 420. The compressed bitstream 420 can be formatted using various techniques, such as variable length coding (VLC) or arithmetic coding. The compressed bitstream 420 can also be referred to as an encoded video stream or encoded video bitstream, and the terms will be used interchangeably herein.

The reconstruction path (shown by the dotted connection lines) can be used to ensure that the encoder 400 and a decoder 500 (described below with respect to FIG. 5) use the same reference frames to decode the compressed bitstream 420. The reconstruction path performs functions that are similar to functions that take place during the decoding process (described below with respect to FIG. 5), including dequantizing the quantized transform coefficients at the dequantization stage 410 and inverse transforming the dequantized transform coefficients at the inverse transform stage 412 to produce a derivative residual block (also called a derivative residual). At the reconstruction stage 414, the prediction block that was predicted at the intra/inter prediction stage 402 can be added to the derivative residual to create a reconstructed block. The loop filtering stage 416 can be applied to the reconstructed block to reduce distortion such as blocking artifacts.

Other variations of the encoder 400 can be used to encode the compressed bitstream 420. In some implementations, a non-transform based encoder can quantize the residual signal directly without the transform stage 404 for certain blocks or frames. In some implementations, an encoder can have the quantization stage 406 and the dequantization stage 410 combined in a common stage.

Figure 5:
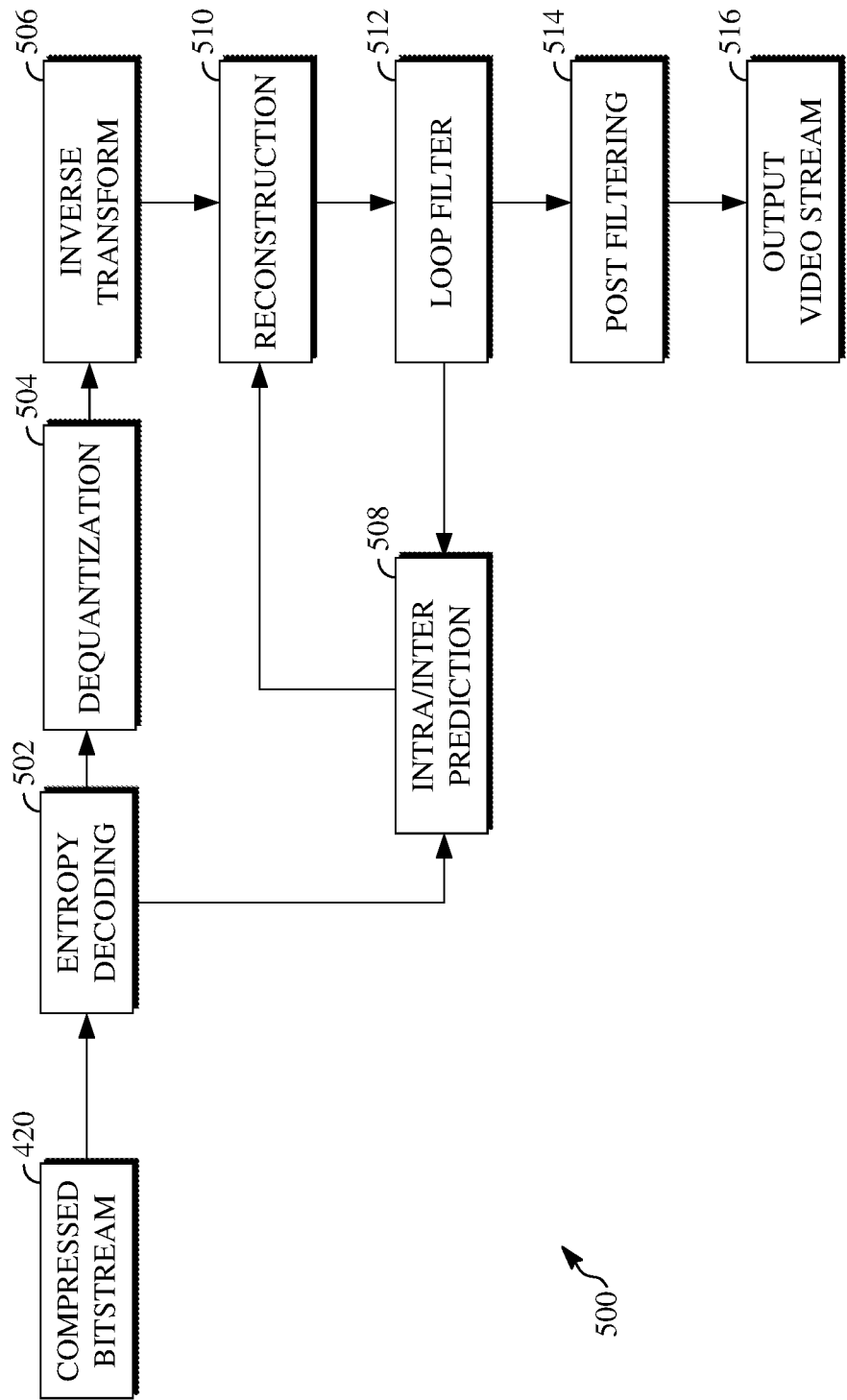
FIG. 5 is a block diagram of a decoder according to implementations of this disclosure.

FIG. 5 is a block diagram of a decoder 500 according to implementations of this disclosure. The decoder 500 can be implemented in the receiving station 106, for example, by providing a computer software program stored in the memory 204. The computer software program can include machine instructions that, when executed by a processor such as the processor 202, cause the receiving station 106 to decode video data in the manner described in FIG. 5. The decoder 500 can also be implemented in hardware included in, for example, the transmitting station 102 or the receiving station 106.

The decoder 500, similar to the reconstruction path of the encoder 400 discussed above, includes in one example the following stages to perform various functions to produce an output video stream 516 from the compressed bitstream 420: an entropy decoding stage 502, a dequantization stage 504, an inverse transform stage 506, an intra/inter prediction stage 508, a reconstruction stage 510, a loop filtering stage 512, and a deblocking filtering stage 514. Other structural variations of the decoder 500 can be used to decode the compressed bitstream 420.

When the compressed bitstream 420 is presented for decoding, the data elements within the compressed bitstream 420 can be decoded by the entropy decoding stage 502 to produce a set of quantized transform coefficients. The dequantization stage 504 dequantizes the quantized transform coefficients (e.g., by multiplying the quantized transform coefficients by the quantizer value), and the inverse transform stage 506 inverse transforms the dequantized transform coefficients to produce a derivative residual that can be identical to that created by the inverse transform stage 412 in the encoder 400. Using header information decoded from the compressed bitstream 420, the decoder 500 can use the intra/inter prediction stage 508 to create the same prediction block as was created in the encoder 400 (e.g., at the intra/inter prediction stage 402).

At the reconstruction stage 510, the prediction block can be added to the derivative residual to create a reconstructed block. The loop filtering stage 512 can be applied to the reconstructed block to reduce blocking artifacts. Other filtering can be applied to the reconstructed block. In this example, the deblocking filtering stage 514 is applied to the reconstructed block to reduce blocking distortion, and the result is output as the output video stream 516. The output video stream 516 can also be referred to as a decoded video stream, and the terms will be used interchangeably herein. Other variations of the decoder 500 can be used to decode the compressed bitstream 420. In some implementations, the decoder 500 can produce the output video stream 516 without the deblocking filtering stage 514.

Techniques for coding binarized video data are now described with respect to FIGS. 6 through 10. For simplicity of explanation, the techniques described with respect to FIGS. 6 through 10 are each depicted and described as a series of steps or operations. However, the steps or operations in accordance with this disclosure can occur in various orders and/or concurrently. Additionally, other steps or operations not presented and described herein may be used. Furthermore, not all illustrated steps or operations may be required to implement a technique in accordance with the disclosed subject matter.

Figure 6:
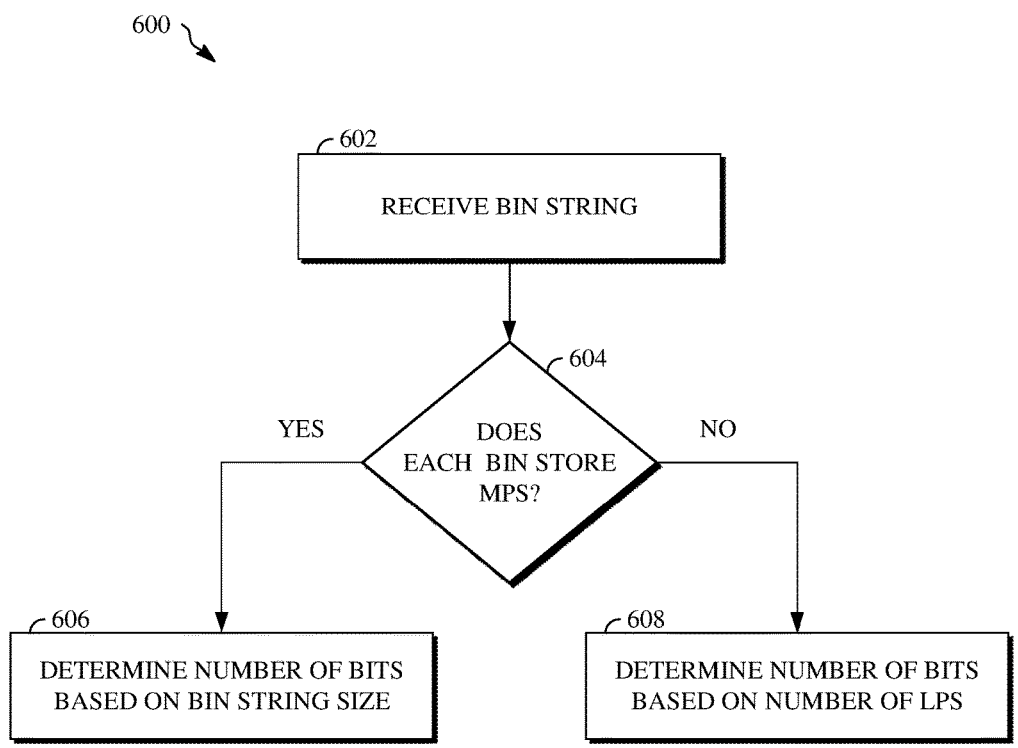
FIG. 6 is a flowchart diagram of an example of a technique for coding binarized video data to a bitstream.

FIG. 6 is a flowchart diagram of an example of a technique 600 for coding binarized video data to a bitstream. The technique 600 can be implemented, for example, as a software program that may be executed by computing devices such as the transmitting station 102 or the receiving station 106. For example, the software program can include machine-readable instructions that may be stored in a memory such as the memory 204 or the secondary storage 214, and that, when executed by a processor, such as the processor 202, may cause the computing device to perform the technique 600. The technique 600 can be implemented using specialized hardware or firmware. For example, a hardware component configured to perform the technique 600 to encode or decode video data. As explained above, some computing devices may have multiple memories or processors, and the operations described in the technique 600 can be distributed using multiple processors, memories, or both.

At 602, a bin string is received. The bin string is representative of binarized video data to be coded. The bin string includes bins that each store a symbol. Each symbol of the bin string corresponds to a portion of the binarized video data. The binarized video data may represent quantized transform coefficients of a transform block. Those quantized transform coefficients are binarized to convert the quantized transform coefficient values into binary-valued symbols. For example, a syntax element may be binarized into one or more binary-valued symbols that are each stored in a separate bin of a bin string. The binarized video data may be represented as a codeword, for example, a unary codeword, a truncated unary codeword, an Exp-Golomb codeword, or the like.

At 604, a determination is made as to whether the symbol stored in each bin of the bin string is a most probable symbol of a probability model available for coding the binarized video data. A probability model may, for example, be or otherwise refer to a context or context model, such as described in the H.264 video coding standard. The probability model reflects a probability that a binary value stored in a bin of the bin string is a '1' or a '0'. The probability model is selected from a plurality of available probability models, such as based on the probabilities of recently-coded binarized video data or other binarized video data spatially nearby to the current binarized video data to code, such as within a video block. The probability model may be a probability model selected for coding one bin or multiple bins of the bin string.

Each bin of the bin string is associated with a probability model. A probability model has a state, or probability, which is updated when the symbol stored in a bin is encoded or decoded according to the probability model. The probability model has a most probable symbol and a least probable symbol. The most probable symbol is the binary value that is most probably coded using the probability model, whereas the least probable symbol is the binary value that is least probably coded using the probability model. The probability model thus reflects a statistical probability that a symbol stored in a bin of the bin string is the most probable symbol.

Determining whether the symbol stored in each bin of the bin string is the most probable symbol can include scanning the symbols stored in each bin string and comparing them to the most probable symbol. This may, for example, be a pre-processing step to using the probability model. Determining whether the symbol stored in each bin of the bin string is the most probable can also thus include selecting the probability model and identifying the most probable symbol thereof. For example, different probability models may be used to encode a set of motion vector differences versus a set of quantized transform coefficients.

At 606, responsive to determining that the symbol stored in each bin of the bin string is the most probable symbol, a number of bits to use to code the binarized video data is determined based on a size of the bin string. Determining the number of bits to use to code the binarized video data based on the size of the bin string includes updating the probability model based on the size of the bin string.

As described above, a probability model has a probability that is updated when a symbol stored in a bin is encoded or decoded according to the probability model. Updating the probability model causes a number of bits required to code a binary-valued symbol to change. For example, before processing a current bin, the probability that a symbol is a most probable symbol of the probability model may reflect that 0.1538 bits are required to code the most probable symbol. However, responsive to determining that the symbol stored in the current bin is the most probable symbol, the probability model can be updated to increase the probability that symbols coded according to the probability model are the most probable symbol. As a result, for example, the probability that a symbol is the most probable symbol may be updated to reflect that 0.1429 bits are now required to code the most probable symbol.

Because it has been determined that each bin of the bin string stores the most probable symbol, the probability model can be updated at one time to determine the number of bits required to code the most probable symbol, rather than updating the probability incrementally based on each individual bin. That is, the updates to the probability model that would otherwise have been made if each bin were processed individually can be combined to calculate the number of bits required for coding the most probable symbol based on the bin size (e.g., based on the number of most probable symbols stored in the bins of the bin string). Implementations and examples for determining the number of bits to use to code binarized video data based on a size of a bin string are described below with respect to FIG. 7.

Alternatively, at 608, responsive to determining that the symbol stored in each bin of the bin string is not the most probable symbol, a number of bits to use to code the binarized video data is determined based on a number of least probable symbols stored in the bins of the bin string. Determining the number of bits to use to code the binarized video data based on the number of bins of the bin string storing a symbol that is not the most probable symbol includes updating the probability model based on the number of bins of the bin string storing a symbol that is not the most probable symbol.

Because it has been determined that at least one bin of the bin string does not store the most probable symbol, the number of bins of the bin string that do not store the most probable symbol is determined. The probability model is thus updated based on the number of bins that do not store the most probable symbol to determine a new probability for the most probable symbol. For example, before processing a current bin, the probability that a symbol is a most probable symbol of the probability model may reflect that 0.4675 bits are required to code the most probable symbol and 2 bits are required to code a least probable symbol. However, responsive to determining that the symbol stored in the current bin is not the most probable symbol, the probability model can be updated to increase the probability that symbols coded according to the probability model are not the most probable symbol. As a result, for example, the probability that a symbol is the most probable symbol may be updated to reflect that 0.48 bits are now required to code the most probable symbol and 1.75 bits are required to code the least probable symbol.

Updating the probability model in this way may also include determining that a probability of the least probable symbol of the probability model is greater than the probability of the most probable symbol. In such a case, the least probable symbol can become a new most probable symbol of the probability model and the most probable symbol can become a new least probable symbol of the probability model. Implementations and examples for determining the number of bits to use to code binarized video data based on a number of least probable symbols stored in the bins of the bin string are described below with respect to FIG. 9.

At 610, the binarized video data is coded using the number of bits determined at 606 or the number of bits determined at 608. For example, during encoding where each bin of the bin string stores the most probable symbol, the binarized video data is encoded to a space of a bitstream having a size equal to the number of bits determined based on the size of the bin string. In another example, during encoding where each bin of the bin string does not store the most probable symbol, the binarized video data is encoded to a space of a bitstream having a size equal to the number of bits determined based on the number of bins that do not store the most probable symbol.

The number of bits to use to code the binarized data may, in at least some cases, be determined in a single clock cycle. For example, the technique 600 can include determining the state that the probability model will be in based on the number of most probable symbols and/or least probable symbols stored in the bins of the bin string before accessing a lookup table. The technique 600 may then include accessing the lookup table one time to determine the number of bits to use to code the bin string based on the updated state information. That is, because each bin of the bin string is coded according to a same probability model and the number of bits to use to code the bin string can be determined by updating the probability model before the coding, as little as one clock cycle may be required to code the bin string. This may in particular be the case where each bin of the bin string stores the same binary-valued symbol.

In some implementations, where each bin of the bin string stores either the most probable symbol or the least probable symbol, except that the last bin at the end of the bin string stores the opposite symbol, that last bin can be processed differently from the rest of the bins of the bin string. For example, the original bins of the bin string (e.g., the bins that each store the most probable symbol or the least probable symbol) are a first section of the bin string and may be referred to as the prefix, and the bin at the end that stores the opposite symbol is a second section of the bin string and may be referred to as the suffix.

In such an implementation, the technique 600 can include operations before the determination at 604 to identify the prefix and the suffix. The determination at 604 can then include determining whether each bin of the prefix stores the same symbol (e.g., either the most probable symbol or the least probable symbol) and whether the suffix stores the opposite symbol. If so, the prefix and the suffix may be separately processed (e.g., using the operations at 606 or 608, as applicable). In some implementations, processing the prefix may cause the most probable symbol and the least probable symbol to switch, for example, as described below with respect to FIG. 10. In some implementations, processing the suffix may cause the most probable symbol and the least probable symbol to switch. In some implementations, processing the prefix may cause a first such switch and processing the suffix may cause a second such switch.

In some implementations, the binarized video data may be used to indicate a significance map for one or more video blocks encoded to the bitstream. For example, a significance map can be specified for each transform block to be encoded to a bitstream. A significance map can indicate the non-zero coefficients within the corresponding transform block, such as according to a scan order for the encoding. Each coefficient in the transform block is represented by a bin storing a binary-valued symbol. For example, when a bin stores a 0, the coefficient represented by that bin is zero. However, when a bin stores a 1, the coefficient represented by that bin is non-zero. If the coefficient is non-zero, another flag is used to indicate whether that bin represents the last non-zero coefficient of the transform block.

There may be a maximum of N (e.g., 15) contexts defined for significance maps. The context of each bin is defined based on the position of a coefficient the bin represents (e.g., in a scan order). Each context thus inversely maps to one or more of the coefficients. The contexts that will be used for the significance map coding, as well as the number of times each will be used, can be determined by this inverse mapping.

The transform block can be represented as tuples of (Run, Level, Last) values, where Run reflects the number of zero coefficients that occur in the transform block before a next non-zero coefficient, Level reflects the non-zero coefficient immediately following the Run, and Last reflects whether that the Level is the last non-zero coefficient in the transform block. Calculating the number of bits to use to code each coefficient flag for a given (Run, Level) pair would cause each such flag to be successively processed since there may be dependencies between ones of the pairs (e.g., in the nature of contexts being shared across multiple coefficient indexes for the transform block).

Instead, a count of times each context is accessed during a given Run can be calculated based on an initial scan position and a scan position of an Nth coefficient along with the Run preceding that Nth coefficient. A group of bin strings can be defined where each bin string includes a prefix of bins storing the value 0 and a suffix of one bin storing the value 1 for non-zero coefficients. One such bin string may, for example, be the bin string processed by the technique 600. For example, the technique 600 can be performed to determine a number of bits required to code a subset of a significant map for a transform block. Each of the N contexts available for coding the transform block coefficients for the significance map can be stored in a hardware register to improve processing performance. A significance map may thus be processed in N cycles, where N represents the number of non-zero coefficients in a transform block.

In some implementations, the encoded binarized video data may be used to indicate a coefficient level for one or more video blocks encoded to the bitstream. For example, in H.264, a coefficient level for a non-zero coefficient is specified differently for prefix and suffix. For a prefix, a Truncated unary code is used, which represents coefficient levels from 1 to 15. For a suffix, an Exp-Golomb code is used, which represents coefficients levels greater than and equal to 16. The suffix is typically encoded without using probability modeling as a bypass bin, and, therefore, is coded using one bit.

Contrastingly, each prefix uses two contexts. A first context is used for a first bin of the bin string, and a second context is used for each other bin of the bin string. As these contexts are independent of one another, the first bin and the rest of the bins can be parallel processed. For example, the first bin of the prefix can be separated into a first section of the bin string and the remaining bins of the prefix can be separated into a second section of the bin string. The first section and the second section can be processed using the technique 600 in parallel such that the entire bin string can be processed in one clock cycle.

Figure 7:
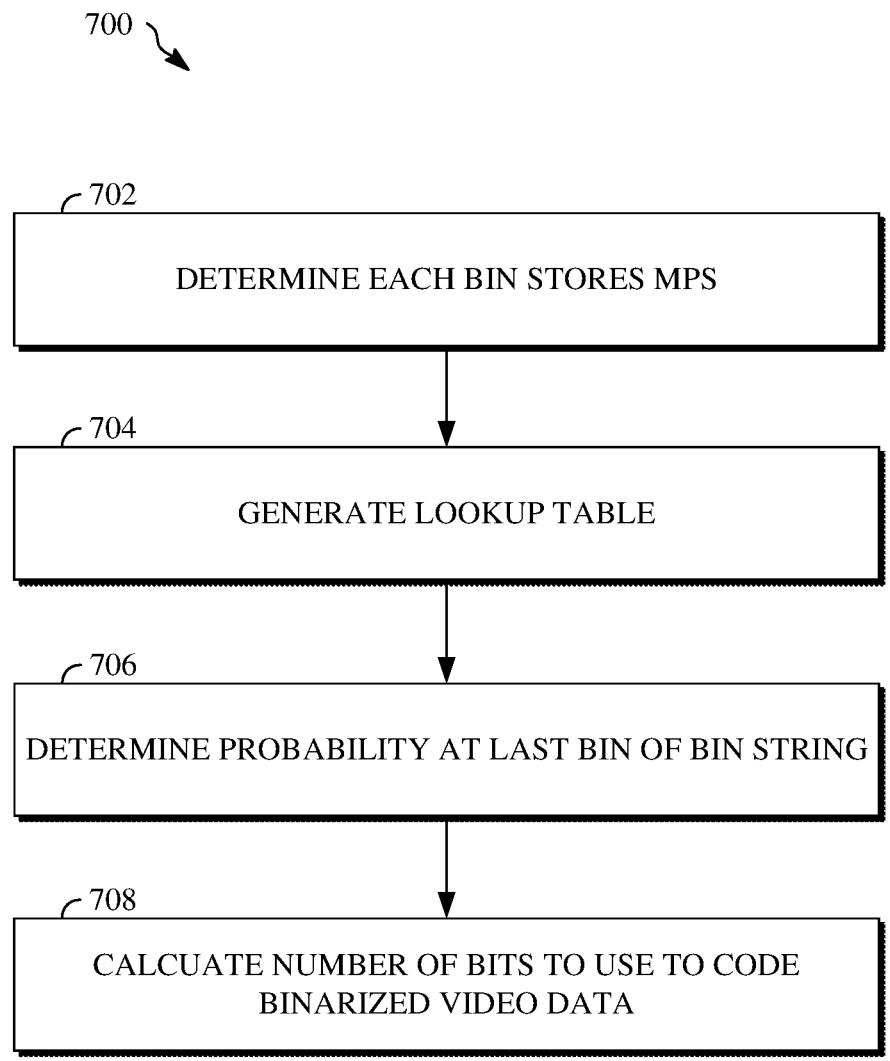
FIG. 7 is a flowchart diagram of an example of a technique for determining a number of bits to use to code binarized video data for a bin string in which each bin stores a most probable symbol of a probability model.

FIG. 7 is a flowchart diagram of an example of a technique 700 for determining a number of bits to use to code binarized video data for a bin string in which each bin stores a most probable symbol of a probability model. The technique 700 may be performed as part of a technique for coding binarized video data. For example, the technique 700 can represent operations performed at 606 of the technique 600 shown in FIG. 6.

At 702, a determination is made that each bin of the bin string stores a most probable symbol of a probability model to use to code binarized video data represented by the bin string. The determination may, for example, reflect the determination made at 604 of the technique 600 shown in FIG. 6. As such, in some implementations, the determination at 702 can be omitted from the technique 700.

At 704, a lookup table is generated. The lookup table is generated based on the size of the bin string and an initial probability of the most probable symbol of the probability model to use to code the binarized video data represented by the bin string. The lookup table includes elements corresponding to ones of the bins of the bin string. The elements are associated with the probabilities that the symbols stored in successive ones of the bins of the bin string are the most probable symbol. For example, a first element of the lookup table may correspond to a first bin of the bin string and be associated with an initial probability of the most probable symbol (e.g., reflecting a probability that a symbol stored in the first bin of the bin string is the most probable symbol). In another example, a last element of the lookup table may correspond to a last bin of the bin string and be associated with a final probability of the most probable symbol (e.g., reflecting a probability that a symbol stored in the last bin of the bin string is the most probable symbol).

The lookup table may be stored in a static memory available to a hardware component performing the technique 600. The static memory may, for example, be a local static random access memory (SRAM), a dynamic random access memory (DRAM), or the like. The lookup table may, for example, be accessed once per clock cycle for a processor of or otherwise used by the hardware component. The numbers of bits associated with elements of the lookup table may be stored in Q(4) notation, for example, to handle situations where the number of bits represents a fractional value. Each probability model may be stored in the memory using seven bits, where six bits are reserved for the different state numbers of the probability model and the seventh bit is reserved for the most probable symbol at that state.

The lookup table is used to update the probability of the most probable symbol, such as to determine a number of bits to use to code binarized video data represented by a bin storing having bins that each store the most probable symbol. Updating the probability of the most probable symbol can include updating an initial probability of the most probable symbol according to the probabilities that the symbols stored in successive ones of the bins of the bin string are the most probable symbol.

At 706, a probability that a last bin of the bin string stores the most probable symbol is determined using the lookup table. Coding a most probable symbol can increase a state of the probability model by one, which state may reflect a value of 0 to 62, inclusive. For a bin string having N bins that each store the most probable symbol, the final state after coding the N bins is the lesser of 62 and the initial state of the probability model plus N. As such, the state for the Nth bin of the bin string can be identified. The state for the Nth bin reflects the probability that the Nth bin of the bin string is the most probable symbol (e.g., the final probability of the most probable symbol). Implementations and examples for updating probabilities of a most probable symbol of a probability model using elements of a lookup table are described below with respect to FIG. 8.

At 708, a number of bits to use to code the binarized video data is calculated. The number of bits is calculated based on the final probability of the most probable symbol. For example, calculating the number of bits to use to code the binarized video data can include multiplying the size of the bin string and a number of bits required to encode the most probable symbol according to the final probability of the most probable symbol. That is, the number of bits to use to code binarized video data represented by a bin string where each bin stores the most probable symbol is equal to the product of the number of bins in the bin string and the number of bits required to code the most probable symbol according to the final probability of the most probable symbol (e.g., according to the final state of the probability model resulting from updating the probability model based on the size of the bin string).

Figure 8:
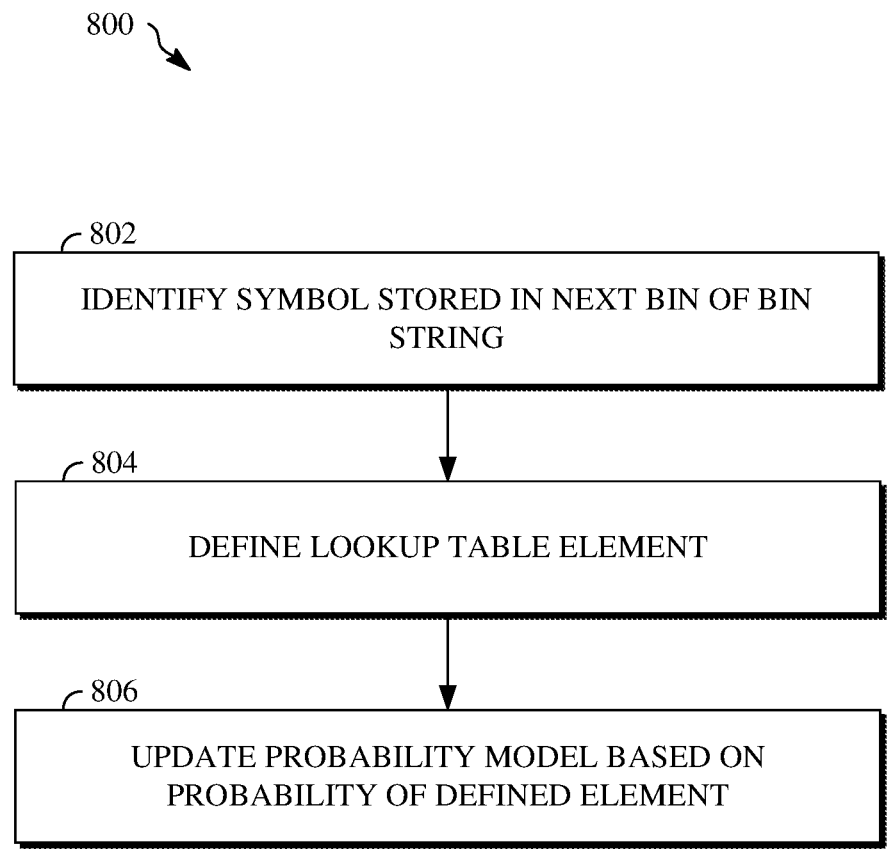
FIG. 8 is a flowchart diagram of an example of a technique for updating probabilities of a most probable symbol of a probability model using elements of a lookup table.

FIG. 8 is a flowchart diagram of an example of a technique 800 for updating probabilities of a most probable symbol of a probability model using elements of a lookup table. The technique 800 may be performed as part of a technique for coding binarized video data. For example, the technique 800 can represent operations performed at 704 of the technique 700 shown in FIG. 7.

At 802, a symbol stored in a next bin of the bin string is identified. For example, if the next bin is the first bin of the bin string, the symbol stored in the first bin is identified. If the bin last-processed bin was the first bin of the bin string, the symbol stored in the second bin of the bin string is identified. Identifying the symbol stored in a bin of the bin string includes determining whether the symbol stored in that bin is a most probable symbol of a probability model to use to code binarized video data represented by the bin string or a least probable symbol of that probability model.

At 804, a lookup table element is defined for the bin storing the identified symbol. Defining an element of the lookup table includes generating a new entry of the lookup table to include one or more of a value of the state associated with the probability that the bin storing the identified symbol is the most probable symbol, an index of that bin within the bin string, a number of bits to use to code the most probable symbol based on the probability associated with the state for the element, or the like, or a combination thereof. For example, an element of the lookup table may be defined as:

$$BitsPerMPSString[N][S] = \sum_{i}^{N} (BitsMPS[\text{Min}(62, S + i - 1)]),$$

where N is the index of the bin storing the identified symbol (e.g., the number of bins storing the most probable symbol in the bin string up through and including the bin storing the identified symbol), S is the state for the element being defined, BitsMPS is the number of bits required to code the most probable symbol at the state S, and BitsPerM-PSString[N][S] is the total number of bits required to code the bin string up through and including the bin storing the identified symbol.

At 806, the probability model to use to code the binarized video data represented by the bin string is updated based on a probability of the newly defined element. Updating the probability model can include increasing the state associated with the probability of the most probable symbol by one based on the addition of one new element to the lookup table. As such, the probability of a most probable symbol of a probability model can be updated according to probabilities that symbols stored in successive bins of the bin string are the most probable symbol.

Figure 9:
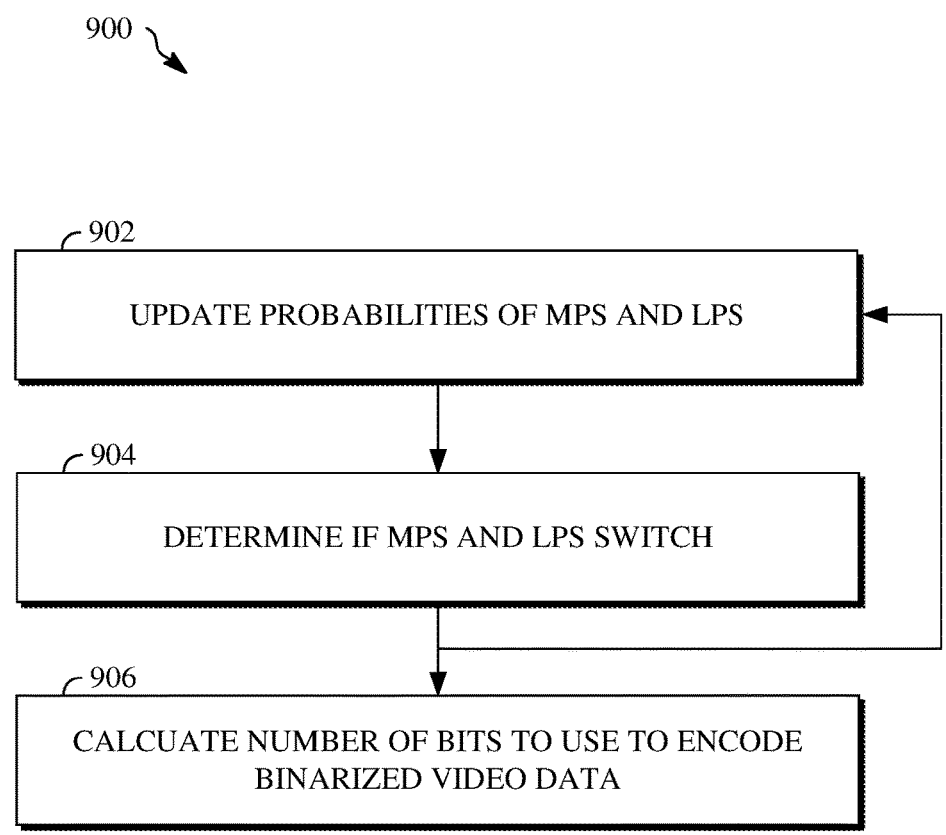
FIG. 9 is a flowchart diagram of an example of a technique for determining a number of bits to use to code binarized video data for a bin string in which some bins do not store a most probable symbol of a probability model.

FIG. 9 is a flowchart diagram of an example of a technique 900 for determining a number of bits to use to code binarized video data for a bin string in which some bins do not store a most probable symbol of a probability model. The technique 900 may be performed as part of a technique for coding binarized video data. For example, the technique 900 can represent operations performed at 608 of the technique 600 shown in FIG. 6.

At 902, probabilities of the most probable symbol and a least probable symbol of the probability model are updated. The probability of the least probable symbol is updated according to probabilities that symbols stored in ones of the bins of the bin string are the least probable symbol. The probability of the least probability symbol is updated by decreasing a state of the probability model according to whether the symbol stored in a current bin is the least probable symbol. For example, if the current bin stores the least probable symbol, the state of the probability model is decreased by one.

The probability of the most probable symbol is updated according to probabilities that symbols stored in the ones of the bins of the bin string are the most probable symbol. The probability of the most probability symbol is updated by increasing the state of the probability model according to whether the symbol stored in a current bin is the most probable symbol. For example, if the current bin stores the most probable symbol, the state of the probability model is increased by one.

The probabilities of the most probable symbol and the least probable symbol (e.g., the increasing or decreasing of the state of the probability model) can be performed by accessing a lookup table associated with the probability model. For example, the lookup table may be stored in a local SRAM or other memory accessible by a component performing the updating.

At 904, during the updating of the probabilities of the most probable symbol and the least probable symbol, a determination is made as to whether the most probable symbol and the least probable symbol have switched. For example, this determination can be made after each update to the probabilities of the least probable symbol and the most probable symbol. Alternatively, this determination can be made at the end of after N updates thereto.

The most probable symbol and the least probable switch when the probability that the a symbol stored in a bin of the bin string is the least probable symbol is greater than the probability that such a symbol is the most probable symbol. As such, determining that the most probable symbol and the least probable symbol have switched includes comparing the probabilities of the most probable symbol and the least probable symbol (e.g., after an update thereto) to determine whether the probability of the least probable symbol is greater than the probability of the most probable symbol.

As a result of the switching, the least probable symbol becomes the most probable symbol of the probability model and that the most probable symbol becomes the least probable symbol of the probability model. After the switching, or after determining not to switch the most probable symbol and the least probable symbol, if there are further bins in the bin string to process (e.g., to use to update the probabilities of the most probable symbol and/or the least probable symbol), the technique 900 returns to 902. Implementations and examples for determining that updating the probability of the least probable symbol based on a symbol stored in an identifiable bin of the number of bins causes the probability of the least probable symbol to be greater than the probability of the most probable symbol are described below with respect to FIG. 10.

At 906, a number of bits to use to code the binarized video data is calculated. The number of bits is calculated based on the updated probability of the least probable symbol and the updated probability of the most probable symbol. For example, after updating the probabilities of the least probable symbol and the most probable symbol based on the full bin string, the probability model will be at a final state. The final state will be associated with the number of bits required to code each of the most probable symbol and the least probable symbol. The number of bits can thus be calculated by adding a first value and a second value, where the first value is a product of the number of bits required to code the most probable symbol and the number of most probable symbols stored in the bin string, and where the second value is a product of the number of bits required to code the least probable symbol and the number of least probable symbols in the bin string.

In some implementations, the loop of operations beginning with identifying a next symbol and ending with determining whether the probability of the least probable symbol is greater than the probability of the most probable symbol can be omitted. In place of such omitted operations, the technique 1000 may instead include scanning some or all symbols stored in the bins of the bin string to determine whether there is a number of least probable symbols that will cause the most probable symbol and the least probable symbol to switch.

For example, after a least probable symbol is scanned, a lookup table can be accessed to determine if decreasing the state of the probability model based on that least probable symbol would cause the most probable symbol and the least probable symbol to switch. This may occur for each least probable symbol that is scanned until it is determined that the switch would occur. Alternatively, the number of lookup table accesses can be compared to the current state of the probability model to determine if the switch would occur based on the number of least probable symbols stored in the bin string.

In such an implementation, calculating the number of bits to use to code the binarized video data can include separating the bin string into two sections, where the first section corresponds to bins processed before the most probable symbol and the least probable symbol switched and the second section corresponds to bins processed thereafter. For example, the first section may begin at a first bin of the bin string and end at a bin immediately preceding the bin of the bin string storing the symbol that when processed caused the switch, or, alternatively, at the bin storing the symbol that when processed resulted in the switch. In another example, the second section may begin at the bin storing the symbol that when processed resulted in the switch, or, alternatively, at the bin following thereafter, and end at a last bin of the bin string.

A first bit value can be calculated for the first section of the bin string. A second bit value can be calculated for the second section of the bin string. For example, the first bit value and/or the second bit value can be calculated by determining first values and second values of each, such as described above. The first bit value and the second bit value can then be added together to calculate the number of bits to use to code the binarized video data.

Figure 10:
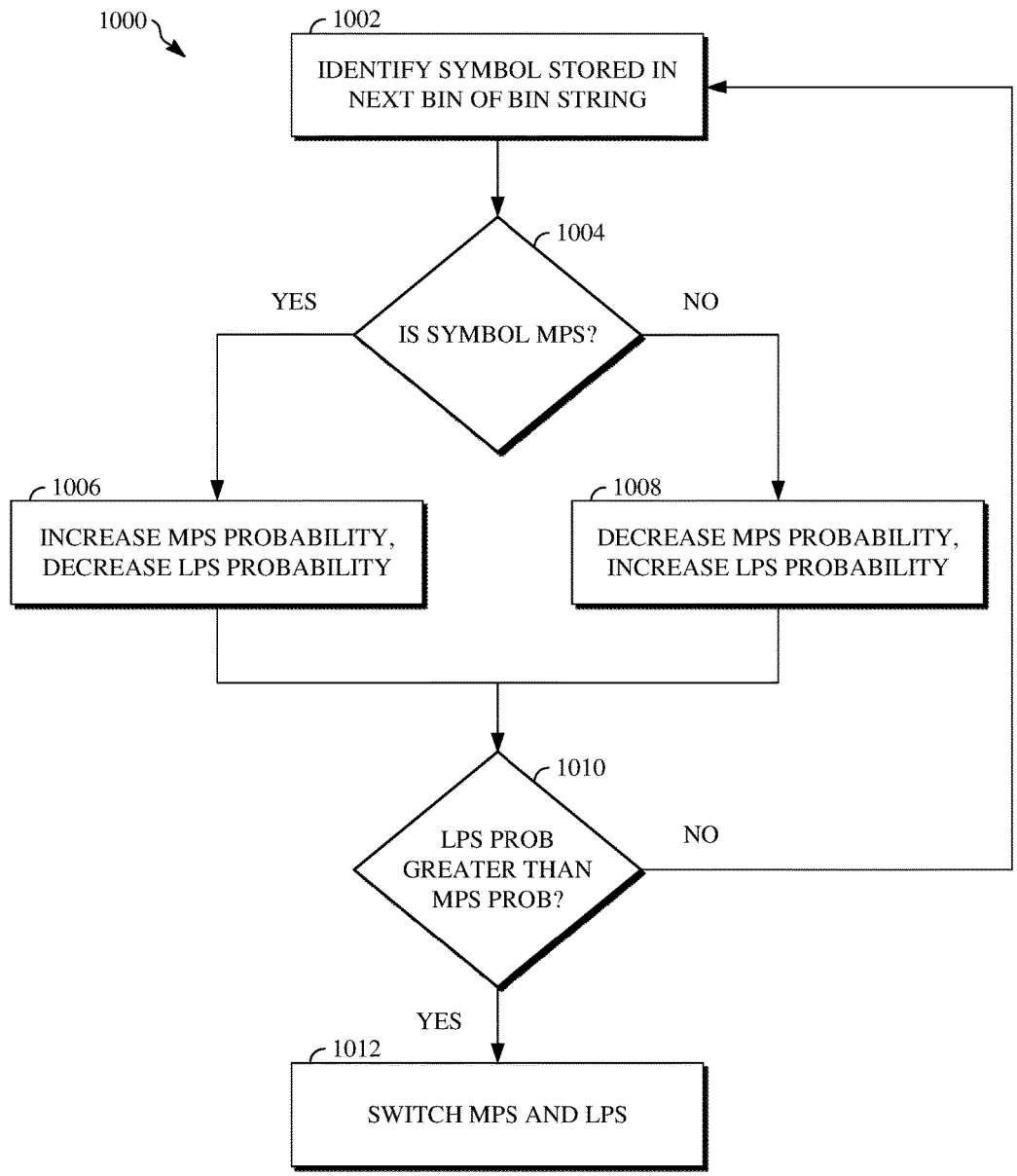
FIG. 10 is a flowchart diagram of an example of a technique for determining changes in probabilities of a most probable symbol and a least probable symbol of a probability model.

FIG. 10 is a flowchart diagram of an example of a technique 1000 for determining changes in probabilities of a most probable symbol and a least probable symbol of a probability model. The technique 1000 may be performed as part of a technique for coding binarized video data. For example, the technique 1000 can represent operations performed at 902 and 904 of the technique 900 shown in FIG. 9.

At 1002, a symbol stored in a next bin of the bin string is identified. For example, if the next bin is the first bin of the bin string, the symbol stored in the first bin is identified. If the bin last-processed bin was the first bin of the bin string, the symbol stored in the second bin of the bin string is identified. At 1004, a determination is made as to whether the identified symbol is a most probable symbol of a probability model to use to code binarized video data represented by the bin string or a least probable symbol of that probability model.

At 1006, responsive to determining that the identified symbol is the most probable symbol, the probability of the most probable symbol is increased and the probability of the least probable symbol is decreased. For example, increasing the probability of the most probable symbol and decreasing the probability of the least probable symbol can include increasing a state of the probability model, such as by accessing a lookup table associated with the probability model.

At 1008, responsive to determining that the identified symbol is not the most probable symbol, the probability of the most probable symbol is decreased and the probability of the least probable symbol is increased. For example, decreasing the probability of the most probable symbol and increasing the probability of the least probable symbol can include decreasing a state of the probability model, such as by accessing a lookup table associated with the probability model. At 1010, a determination is made as to whether the change in probability at 1006 or at 1008 causes the probability of the least probable symbol to be greater than the probability of the most probable symbol.

Responsive to determining that the change in probability did not cause the probability of the least probable symbol to be greater than the probability of the most probable symbol, the technique 1000 returns to 1002 to identify a symbol stored in a next bin of the bin string. For example, if the current state of the probability model is 1 such that the probability of the most probable symbol is only slightly greater than the probability of the least probable symbol and the symbol identified at 1002 is the least probable symbol, the state of the probability model is decreased to 0 such that the probabilities of the most probable symbol and the least probable symbol become equal, but the most probable symbol and the least probable symbol do not switch.

At 1012, responsive to determining that the change in probability did cause the probability of the least probable symbol to be greater than the probability of the most probable symbol, the most probable symbol and the least probable symbol are switched. For example, if the current state of the probability model is 0 and the symbol identified at 1002 is the least probable symbol, the most probable symbol and the least probable symbol switch and the state of the probability model is increased to 1.

In some implementations, after the most probable symbol and the least probable symbol switch, a new lookup table is generated. For example, the new lookup table can be generated as or similar to as described in the technique 800 shown in FIG. 8. For example, elements can be defined based on the new most probable symbol to reference the state of the probability model for that element, the number of bits required to code the new most probable symbol at that state, the number of bits required to code the new least probable symbol at that state, or the like, or a combination thereof.

Figure 11:
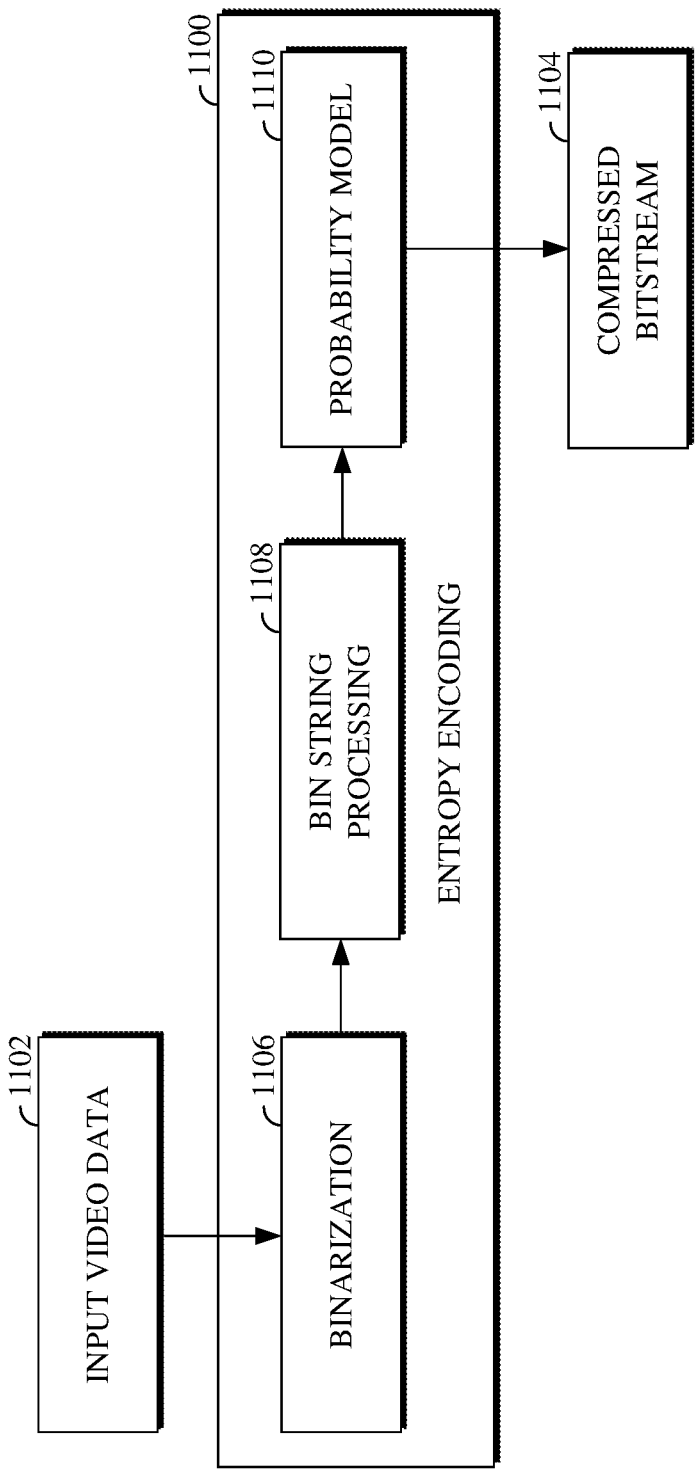
FIG. 11 is a block diagram of an entropy encoding component.

FIG. 11 is a block diagram of an entropy encoding component 1100. The entropy encoding component 1100 may be used to encode input video data 1102 (e.g., binarized video data) to a compressed bitstream 1104, for example, using all or a portion of the technique 600 shown in FIG. 6. The entropy encoding component 1100 may, for example, represent a component used to perform one or more operations of the entropy encoding stage 408 shown in FIG. 4. The input video data 1102 may, for example, represent transform coefficients output by the quantization stage 406 shown in FIG. 4. The compressed bitstream 1104 may, for example, represent the compressed bitstream 420 shown in FIG. 4.

The entropy encoding component 1100 receives the input video data 1102 and binarizes it using a binarization module 1106. Binarizing the input video data 1102 includes transforming the input video data 1102 into binarized video data comprising binary-valued symbols. For example, a series of binary-valued symbols can be produced to represent a quantized transform coefficient, a motion vector direction, or the like.

The binarized video data is output to a bin string processing module 1108. Each symbol of the binarized video data is stored in a separate bin of the bin string. The bin string processing module 1108 can process the symbols stored in each bin of the bin string, for example, to determine the values of those symbols. The bin string processing module 1108 can also determine, select, or otherwise identify a probability model to use to encode the binarized video data represented by the bin string. For example, there may be a plurality of probability models available for encoding data based on one or more contexts of that data.

The output of the bin string processing module 1108 is received by a probability model module 1110. The probability model module 1110 updates the probability model identified by the bin string processing module 1108 based on the values of the symbols stored in the bins of the bin string. Based on the updating, the probability model module 1110 can determine numbers of bits to use to encode the binarized video data. The binarized video data is then encoded to a space of the compressed bitstream 1104 equal to the number of bits determined by the probability model module 1110.

Implementations of the entropy encoding component 1100 may differ from what is shown and described with respect to FIG. 11. In some implementations, the probability model to use to encode the binarized video data may be determined, selected, or otherwise identified other than by the bin string processing module 1108. In some implementations, the probability model module 1110 may output information indicative of the probability model after the updating (e.g., the probabilities of a most probable symbol and a least probable symbol thereof, a final state thereof, a number of bits associated with each of the most probable symbol and the least probable symbol at the final state, or the like), such as to an arithmetic coding module (not shown). The arithmetic coding module can process the information received from the probability model module 1110 to determine the number of bits to use to encode the binarized video data.

Figure 12:
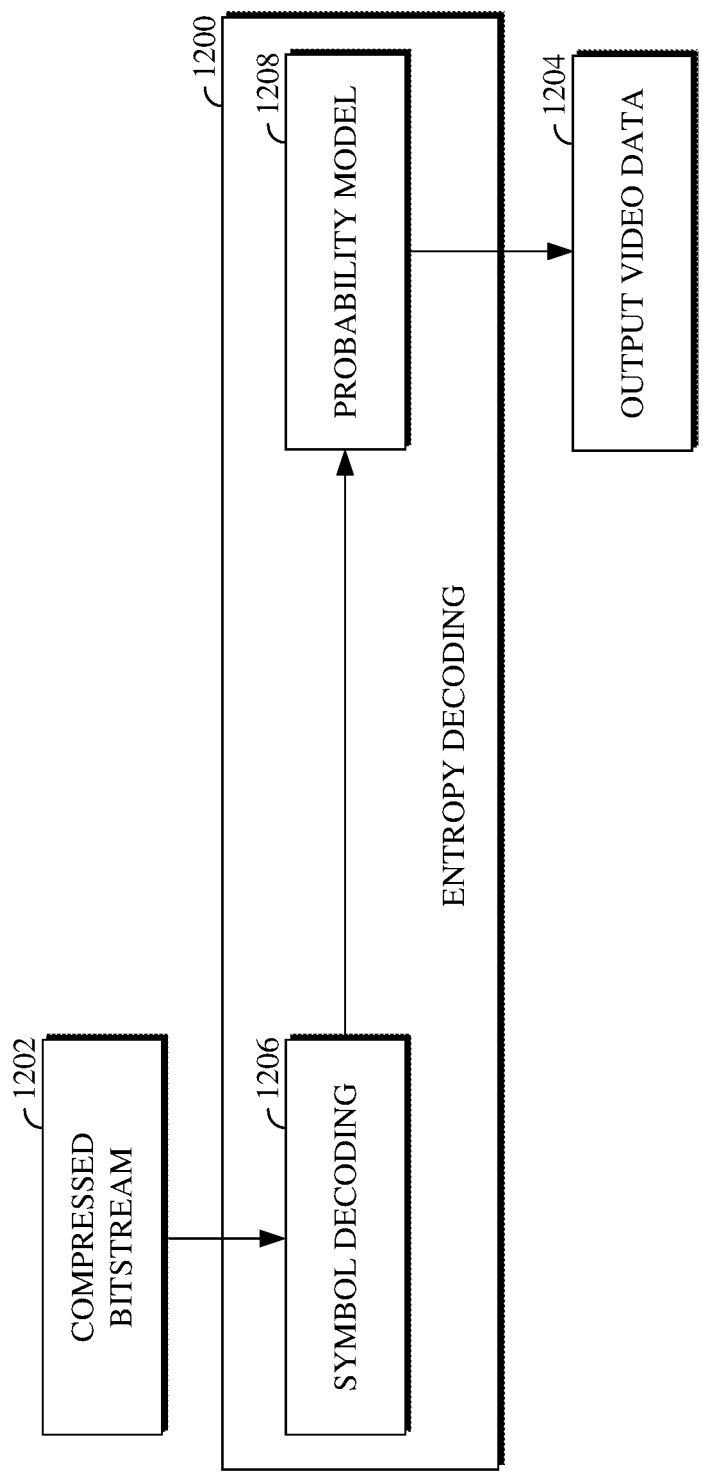
FIG. 12 is a block diagram of an entropy decoding component.

FIG. 12 is a block diagram of an entropy decoding component 1200. The entropy encoding component 1100 may be used to decode binarized video data from a compressed bitstream 1202 to output video data 1204, for example, using all or a portion of the technique 600 shown in FIG. 6. The entropy decoding component 1200 may, for example, represent a component used to perform one or more operations of the entropy decoding stage 502 shown in FIG. 5. The compressed bitstream 1202 may, for example, represent the compressed bitstream 420 shown in FIG. 5. The output video data 1204 may, for example, represent data output to one or more of the dequantization stage 504 or the intra/inter prediction stage 508 shown in FIG. 5.

The entropy decoding component 1200 receives the compressed bitstream 1202 and decodes a plurality of symbols encoded thereto using a symbol decoding module 1206. The symbol decoding module 1206 can, for example, decode an entire bin string worth of encoded symbols from the compressed bitstream 1202. Decoding the symbols of the entire bin string can include determining the number of most probable symbols in the bin string and the number of least probable symbols in the bin string. Decoding the symbols may also include determining, selecting, or otherwise identifying a probability model to use to decode the symbols to the output video data 1204.

The output of the symbol decoding module 1206 is received by a probability model module 1208. The probability model module 1208 updates the probability model identified by the symbol decoding module 1206 based on the values of the symbols stored in the bins of the bin string. Based on the updating, the probability model module 1208 can determine numbers of bits to use to decode the binarized video data. The binarized video data is then decoded to the output video data 1204 using the number of bits determined by the probability model module 1208.

Implementations of the entropy decoding component 1200 may differ from what is shown and described with respect to FIG. 12. In some implementations, the compressed bitstream 1202 may not include data indicating the probability model to use to decode the binarized video data.

FIG. 13 is an illustration of a table 1300 reflecting numbers of bits required to code a most probable symbol or a least probable symbol of a probability model based on a given state of the probability model. The table 1300 includes 63 entries. Each entry includes a value of a state of the probability model, a number of bits required to code a most probable symbol at that state, and a number of bits required to code a least probable symbol at that state.

The table 1300 may, for example, represent data stored in a lookup table generated or otherwise used in connection with determining a number of bits to use to encode binarized video data to or decode binarized video data from a bitstream. Alternatively, in another example, such a lookup table may include only a portion of the table 1300, such as the entries that are defined based on an initial state of the probability model and the states to which the probability model is updated.

FIG. 14 is an illustration of a table 1400 reflecting probability changes for a most probable symbol and a least probable symbol of a probability model. In the table 1400, S represents the initial state of the probability model and C represents the number of least probable symbols that, if successively processed starting at the initial state S, will cause the most probable symbol and the least probable symbol to switch.

The aspects of encoding and decoding described above illustrate some examples of encoding and decoding techniques. However, it is to be understood that encoding and decoding, as those terms are used in the claims, could mean compression, decompression, transformation, or any other processing or change of data.

The word "example" is used herein to mean serving as an example, instance, or illustration. Any aspect or design described herein as "example" is not necessarily to be construed as being preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise or clearly indicated otherwise by the context, the statement "X includes A or B" is intended to mean any of the natural inclusive permutations thereof. That is, if X includes A; X includes B; or X includes both A and B, then "X includes A or B" is satisfied under any of the foregoing instances. In addition, the articles "a" and "an" as used in this application and the appended claims should generally be construed to mean "one or more," unless specified otherwise or clearly indicated by the context to be directed to a singular form. Moreover, use of the term "an implementation" or the term "one implementation" throughout this disclosure is not intended to mean the same embodiment or implementation unless described as such.

Implementations of the transmitting station 102 and/or the receiving station 106 (and the algorithms, methods, instructions, etc., stored thereon and/or executed thereby, including by the encoder 400 and the decoder 500) can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably. Further, portions of the transmitting station 102 and the receiving station 106 do not necessarily have to be implemented in the same manner.

Further, in one aspect, for example, the transmitting station 102 or the receiving station 106 can be implemented using a general purpose computer or general purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

The transmitting station 102 and the receiving station 106 can, for example, be implemented on computers in a video conferencing system. Alternatively, the transmitting station 102 can be implemented on a server, and the receiving station 106 can be implemented on a device separate from the server, such as a handheld communications device. In this instance, the transmitting station 102, using an encoder 400, can encode content into an encoded video signal and transmit the encoded video signal to the communications device. In turn, the communications device can then decode the encoded video signal using a decoder 500. Alternatively, the communications device can decode content stored locally on the communications device, for example, content that was not transmitted by the transmitting station 102. Other suitable transmitting and receiving implementation schemes are available. For example, the receiving station 106 can be a generally stationary personal computer rather than a portable communications device, and/or a device including an encoder 400 may also include a decoder 500.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or semiconductor device. Other suitable mediums are also available.

The above-described embodiments, implementations, and aspects have been described in order to facilitate easy understanding of this disclosure and do not limit this disclosure. On the contrary, this disclosure is intended to cover various modifications and equivalent arrangements included within the scope of the appended claims, which scope is to be accorded the broadest interpretation as is permitted under the law so as to encompass all such modifications and equivalent arrangements.

What is claimed is:

1. A method for encoding binarized video data based on changes in probabilities of a probability model, the method comprising:

receiving, using one or more processors, a bin string representative of the binarized video data, the bin string including bins that each store a symbol;

identifying, using the one or more processors, the symbol stored in one of the bins as a current symbol;

determining, using the one or more processors, whether the current symbol is a most probable symbol of the probability model;

responsive to determining that the current symbol is not the most probable symbol, updating, using the one or more processors, at least one of the probabilities, the probabilities including a first probability associated with the most probable symbol and a second probability associated with a least probable symbol of the probability model;

subsequent to updating the probabilities, determining, using the one or more processors, whether the second probability is greater than the first probability;

responsive to determining that the second probability is greater than the first probability, switching, using the one or more processors, the most probable symbol and the least probable symbol to reflect that the least probable symbol is a new most probable symbol of the probability model and to reflect that the most probable symbol is a new least probable symbol of the probability model;

determining, using the one or more processors, a first number of bits to use to encode the binarized video data using the new most probable symbol; and encoding, using the one or more processors, the binarized video data to a bitstream using the first number of bits.

2. The method of claim 1, further comprising:

responsive to determining that the current symbol is the most probable symbol, updating using the one or more processors, the probabilities by increasing the first probability and decreasing the second probability;

subsequent to updating the probabilities by increasing the first probability and decreasing the second probability, determining, using the one or more processors, a second number of bits to use to encode the binarized video data based on at least one of the first probability or the second probability; and encoding, using the one or more processors, the binarized video data to the bitstream using the second number of bits.

3. The method of claim 1, further comprising:

responsive to determining that the second probability is not greater than the first probability subsequent to updating the at least one of the probabilities, determining, using the one or more processors, a third number of bits to use to encode the binarized video data based on at least one of the first probability or the second probability; and encoding, using the one or more processors, the binarized video data to the bitstream using the third number of bits.

4. The method of claim 1, wherein determining the first number of bits to use to encode the binarized video data using the new most probable symbol comprises:

determining, using the one or more processors, the first number of bits based on a third probability of the probabilities, the third probability associated with the new most probable symbol of the probability model.

5. The method of claim 4, wherein the third probability is the second probability.

6. The method of claim 1, wherein determining the first number of bits to use to encode the binarized video data using the new most probable symbol comprises:
  calculating, using the one or more processors, a first bit value for a first section of the bin string beginning at a first bin of the bin string and ending at a bin immediately preceding the one of the bins storing the current symbol, the first bit value based on the first probability subsequent to updating the probabilities;
  calculating, using the one or more processors, a second bit value for a second section of the bin string beginning at the one of the bins storing the current symbol and ending at a last bin of the bin string, the second bit value based on the second probability subsequent to updating the probabilities; and
  calculating, using the one or more processors, the first number of bits as a sum of the first bit value and the second bit value.

7. The method of claim 1, wherein updating the at least one of the probabilities responsive to determining that the current symbol is not the most probable symbol of the probability model comprises:
  decreasing, using the one or more processors, the first probability; and
  increasing, using the one or more processors, the second probability.

8. The method of claim 1, wherein the first probability reflects a probability that symbols stored in ones of the bins of the bin string are the most probable symbol and the second probability reflects a probability that the symbols stored in the ones of the bins of the bin string are the least probable symbol.

9. The method of claim 1, wherein the at least one of the probabilities is updated in a single clock cycle.

10. An apparatus for encoding binarized video data based on changes in probabilities of a probability model, the apparatus comprising:
  a processor configured to execute instructions stored in a non-transitory storage medium to:
    receive a bin string representative of the binarized video data, the bin string including bins that each store a symbol;
    identify the symbol stored in one of the bins as a current symbol;
    determine whether the current symbol is a most probable symbol of the probability model;
    responsive to the determination that the current symbol is not the most probable symbol, update the probabilities by decreasing a first probability associated with the most probable symbol and increasing a second probability associated with a least probable symbol of the probability model;
    subsequent to updating the probabilities, determine whether the second probability is greater than the first probability;
    responsive to a determination that the second probability is greater than the first probability:
      switch the most probable symbol and the least probable symbol to reflect that the least probable symbol is a new most probable symbol of the probability model and to reflect that the most probable symbol is a new least probable symbol of the probability model;
      determine a first number of bits to use to encode the binarized video data using the new most probable symbol; and
      encode the binarized video data to a bitstream using the first number of bits; and
    responsive to a determination that the second probability is not greater than the first probability:
      determine a second number of bits to use to encode the binarized video data based on at least one of the first probability or the second probability; and
      encode the binarized video data to the bitstream using the second number of bits.

11. The apparatus of claim 10, wherein the instructions include instructions to:
  responsive to a determination that the current symbol is the most probable symbol, update the probabilities by increasing the first probability and decreasing the second probability.

12. The apparatus of claim 11, wherein the instructions include instructions to:
  subsequent to updating the probabilities by increasing the first probability and decreasing the second probability, determine a third number of bits to use to encode the binarized video data based on at least one of the first probability or the second probability; and
  encoding the binarized video data to the bitstream using the third number of bits.

13. The apparatus of claim 10, wherein the instructions to determine the first number of bits to use to encode the binarized video data using the new most probable symbol include instructions to:
  determine the first number of bits based on a third probability of the probabilities, the third probability associated with the new most probable symbol of the probability model.

14. The apparatus of claim 10, wherein the instructions to determine the first number of bits to use to encode the binarized video data using the new most probable symbol include instructions to:
  calculate a first bit value for a first section of the bin string beginning at a first bin of the bin string and ending at a bin immediately preceding the one of the bins storing the current symbol, the first bit value based on the first probability subsequent to updating the probabilities;
  calculate a second bit value for a second section of the bin string beginning at the one of the bins storing the current symbol and ending at a last bin of the bin string, the second bit value based on the second probability subsequent to updating the probabilities; and
  calculate the first number of bits as a sum of the first bit value and the second bit value.

15. The apparatus of claim 10, wherein the first probability reflects a probability that symbols stored in ones of the bins of the bin string are the most probable symbol and the second probability reflects a probability that the symbols stored in the ones of the bins of the bin string are the least probable symbol.

16. A method for encoding binarized video data based on changes in probabilities of a probability model, the method comprising:
  receiving, using one or more processors, a bin string representative of the binarized video data, the bin string including bins that each store a symbol;
  updating, using the one or more processors, a probability model available for encoding the binarized video data based on a determination that a current symbol stored in one of the bins is not a most probable symbol of the probability model;
  determining, using the one or more processors, whether the updated probability model reflects a greater probability that symbols stored in ones of the bins of the bin string are a least probable symbol of the probability model than the most probably symbol;

subsequent to determining that the updated probability model reflects the greater probability, determining, using the one or more processors, a first number of bits to use to encode the binarized video data based on a probability associated with the least probable symbol; and encoding, using the one or more processors, the binarized video data to a bitstream using the first number of bits.

17. The method of claim 16, further comprising:

responsive to determining that the updated probability model reflects the greater probability and prior to determining the first number of bits, switching, using the one or more processors, the most probable symbol and the least probable symbol to reflect that the least probable symbol is a new most probable symbol and that the most probable symbol is a new least probable symbol.

18. The method of claim 17, wherein determining the first number of bits to use to encode the binarized video data based on the probability associated with the least probable symbol comprises:

determining, using the one or more processors, the first number of bits based on a probability associated with the new most probable symbol.

19. The method of claim 18, further comprising:

subsequent to switching the most probable symbol and the least probable symbol and prior to determining the first number of bits, updating, using the one or more processors, the probability associated with the new most probable symbol based on a determination that a next symbol stored in a next one of the bins is the new most probable symbol, wherein determining the first number of bits to use to encode the binarized video data based on the probability associated with the least probable symbol includes using the updated probability associated with the new most probable symbol.

20. The method of claim 16, further comprising:

subsequent to determining that the updated probability model does not reflect the greater probability, determining, using the one or more processors, a second number of bits to use to encode the binarized video data based on a probability associated with the most probable symbol; and encoding, using the one or more processors, the binarized video data to a bitstream using the second number of bits.

\* \* \* \* \*